US010679819B2

(12) United States Patent
Kruit

(10) Patent No.: US 10,679,819 B2
(45) Date of Patent: Jun. 9, 2020

(54) ABERRATION CORRECTING DEVICE FOR AN ELECTRON MICROSCOPE AND AN ELECTRON MICROSCOPE COMPRISING SUCH A DEVICE

(71) Applicant: Hitachi High-Technologies Corporation, Minato-ku, Tokyo (JP)

(72) Inventor: Pieter Kruit, Delft (NL)

(73) Assignee: Hitachi High-Tech Corporation, Tokyo (JP)

(*) Notice: Subject to any disclaimer, the term of this patent is extended or adjusted under 35 U.S.C. 154(b) by 23 days.

(21) Appl. No.: 16/316,870

(22) PCT Filed: Jul. 21, 2017

(86) PCT No.: PCT/NL2017/050498
§ 371 (c)(1),
(2) Date: Jan. 10, 2019

(87) PCT Pub. No.: WO2018/016961
PCT Pub. Date: Jan. 25, 2018

(65) Prior Publication Data
US 2019/0228946 A1   Jul. 25, 2019

(30) Foreign Application Priority Data

Jul. 22, 2016   (NL) .................................. 2017213

(51) Int. Cl.
*H01J 37/153*   (2006.01)
*H01J 37/12*    (2006.01)
(Continued)

(52) U.S. Cl.
CPC ............ *H01J 37/153* (2013.01); *H01J 37/12* (2013.01); *H01J 37/1472* (2013.01);
(Continued)

(58) Field of Classification Search
CPC ...... H01J 37/153; H01J 37/12; H01J 37/1472; H01J 2237/151; H01J 2237/152; H01J 2237/1532; H01J 2237/1534
See application file for complete search history.

(56) References Cited

U.S. PATENT DOCUMENTS 5,319,207 A   6/1994 Rose et al.
5,321,262 A   6/1994 Turner
(Continued)

FOREIGN PATENT DOCUMENTS

JP   5-205687 A   8/1993
JP   5-505489 A   8/1993
(Continued)

OTHER PUBLICATIONS

International Search Report (PCT/ISA/210) issued in PCT Application No. PCT/NL2017/050498 dated Nov. 27, 2017 (two pages).
(Continued)

*Primary Examiner* — Nicole M Ippolito
*Assistant Examiner* — Sean M Luck
(74) *Attorney, Agent, or Firm* — Crowell & Moring LLP

(57) ABSTRACT

The invention relates to an aberration correcting device for correcting aberrations of focusing lenses in an electron microscope. The device comprises a first and a second electron mirror, each comprising an electron beam reflecting face. Between said mirrors an intermediate space is arranged. The intermediate space comprises an input side and an exit side. The first and second electron mirrors are arranged at opposite sides of the intermediate space, wherein the reflective face of the first and second mirror are arranged facing said intermediate space. The first mirror is arranged at the exit side and the second mirror is arranged at the input side of the intermediate space. In use, the first mirror receives the electron beam coming from the input side and
(Continued)

reflects said beam via the intermediate space towards the second mirror. The second mirror receives the electron beam coming from the first mirror, and reflects the electron beam via the intermediate space towards the exit side. The incoming electron beam passes said second mirror at a position spaced apart from the reflection position on the second mirror. At least one of the electron mirrors is arranged to provide a correcting aberration to a reflected electron beam.

28 Claims, 15 Drawing Sheets

(51) Int. Cl.
    *H01J 37/147*     (2006.01)
    *H01J 37/26*     (2006.01)
(52) U.S. Cl.
    CPC ..... *H01J 37/261* (2013.01); *H01J 2237/0473* (2013.01); *H01J 2237/0475* (2013.01); *H01J 2237/151* (2013.01); *H01J 2237/152* (2013.01); *H01J 2237/1534* (2013.01); *H01J 2237/26* (2013.01)

(56) References Cited

U.S. PATENT DOCUMENTS

| 2006/0016974 A1 | 1/2006 | Funnemann et al. |
| 2007/0200070 A1 | 8/2007 | Tromp |
| 2009/0095904 A1 | 4/2009 | Koike et al. |
| 2017/0338094 A1 | 11/2017 | Verenchikov et al. |

FOREIGN PATENT DOCUMENTS

| JP | 2006-505898 A | 2/2006 |
| JP | 2009-94020 A | 4/2009 |
| JP | 2013-138037 A | 7/2013 |
| JP | 2017-531291 A | 10/2017 |

OTHER PUBLICATIONS

Written Opinion (PCT/ISA/237) issued in PCT Application No. PCT/NL2017/050498 dated Nov. 27, 2017 (five pages).

Rose et al., "Aberration Correction in Electron Microscopy", Proceedings of 2005 Particle Accelerator Conference, May 16, 2005, pp. 44-48, XP010890717, five pages.

Japanese-language Office Action issued in counterpart Japanese Application No. 2019-501645 dated Dec. 17, 2019 with English translation (nine (9) pages).

ABERRATION CORRECTING DEVICE FOR AN ELECTRON MICROSCOPE AND AN ELECTRON MICROSCOPE COMPRISING SUCH A DEVICE

BACKGROUND

The invention relates to an aberration correcting device for an electron microscope, and to an electron microscope comprising such an aberration correcting device.

Electron lenses as used in electron microscopes intrinsically suffer from a positive spherical and chromatic aberration. These aberrations limit the resolution of said electron microscopes. It is possible to at least partially compensate for these aberrations by introducing other components in the electron microscope column that provide a negative spherical and chromatic aberration.

The United States Patent Application US2007/0200070 discloses an aberration-correcting microscopy instrument comprising an electron mirror configured for correction of one or more aberrations. The instrument is provided with a magnetic deflector which deflects the incoming electron beam, coming from the electron gun, over an angle of 90 degrees towards the electron mirror. The electron mirror is arranged such that the mirror axis is arranged perpendicular to the optical axis of the incoming electron beam. The electron mirror corrects for both chromatic and spherical aberration, and reflects the corrected electron beam back to the magnetic deflector. The reflected beam is again deflected over an angle of 90 degrees by the magnetic deflector, which returns the reflected beam onto the same optical axis as the incoming beam.

A disadvantage of the known system is that the electron beam experiences a focusing effect by the magnetic field of the magnetic deflector. Moreover the focusing effect in the plane of deflection is different from the focusing effect in a plane perpendicular to the plane of deflection. In addition, the actual deflection angle of the electrons in the electron beam depends on the energy of the electrons, which causes dispersion for electron beams comprising electrons with different energies. These effects deteriorate the resolution of the electron microscope, and must be carefully compensated in the aberration-correcting microscopy instrument in order to improve the resolution in the microscope. This leads to complex designs with many magnetic coils and high demands on the accuracy of the manufacturing.

An alternative system for removing distortions from an electron image is described in U.S. Pat. No. 5,321,262, which discloses an image band pass filter for a photoelectron spectromicroscope. The image band pass filter comprises two stages, a first stage comprising a region in which a beam of imaging electrons is deflected in the crossed electrostatic and magnetic field between a succession of electron mirrors which are designed to remove electrons of a certain energy and reflect those of a particular energy which are to form the electron image. The beam from the first stage is then transferred to a second stage through a high pass filter into a region of the second stage and then deflected in an electrostatic and magnetic cross field along a path corresponding to a restoration of the displacement of the original beam in the first stage from its original path of travel. In the first and second stage, the electrostatic field of the cross field is designed to be non-uniform to control motion of the electrons in the cross field and to correct for distortion of the image in the output beam. Accordingly, the image band pass filter as described in U.S. Pat. No. 5,321,262 is designed to remove distortion of the electron image due to the use of inhomogeneous electrostatic fields of the deflecting crossed electrostatic or magnetic field employed.

It is an object of the present invention to ameliorate one or more of these problems or to at least provide an alternative aberration correcting device for an electron microscope.

SUMMARY OF THE INVENTION

According to a first aspect, the present invention provides an aberration correcting device for correcting aberrations of an electron beam in an electron microscope, wherein the aberration correcting device comprises:

a first and a second electron mirror, each comprising an electron beam reflecting face, an intermediate space, wherein the intermediate space comprises a input side for inputting the electron beam into the intermediate space, and an exit side for exiting the electron beam out of the intermediate space, wherein the first and second electron mirror are arranged at opposite sides of the intermediate space, and wherein the reflective face of the first electron mirror and the reflective face of the second mirror are arranged to face said intermediate space, wherein the first mirror is arranged at the exit side and is configured to receive the electron beam coming from the input side and to reflect the electron beam via the intermediate space towards the second mirror, wherein the second mirror is arranged at the input side and is configured to receive the electron beam coming from the first mirror at a reflection position or a reflection area on the second mirror and to reflect the electron beam via the intermediate space towards the exit side, wherein the aberration correcting device is configured such that an incoming electron beam passes said second mirror at a position spaced apart from the reflection position or reflection area on the second mirror, and wherein at least one of said first and second electron mirrors is configured to provide a correcting aberration to a reflected electron beam.

The aberration correcting device according to the present invention comprises at least two electron mirrors, which are arranged such that the reflecting faces of these mirrors substantially face each other. The first electron mirror is arranged at the exit side of the intermediate space, and the second electron mirror is arranged at an input side of the intermediate space. According to the invention, the first and second sides are opposite sides of the intermediate space.

In use, the intermediate space is arranged in the beam path of an incoming electron beam. Said incoming electron beam traverses said intermediate space from the input side to the first mirror. At the first mirror, the electron beam is reflected by the first mirror towards the intermediate space. The reflected electron beam again traverses said intermediate space from the first mirror to the second mirror. At the second mirror, the electron beam is reflected by the second mirror towards the intermediate space. The reflected electron beam again traverses said intermediate space from the second mirror to the output side. Accordingly, the beam path of the electron beams in the aberration correcting device according to the invention is effectively folded up. An advantage of the aberration correcting device of the present invention is, that the lateral space, that is the space in a direction perpendicular to an optical axis of the electron microscope, can be much more limited that the aberration correcting device of US 2007/0200070, which allows to apply the aberration correcting device more easily in standard electron microscopes, and/or to retrofit existing electron microscopes with the aberration correcting device of the present invention.

According to the present invention, at least one of said first and second electron mirrors is configured to provide a correcting aberration to a reflected electron beam, which correcting aberration is configured to at least partially counteract an optical aberration of one or more electron optical elements in an electron microscope.

It is noted that the aberration correcting device of the present invention does not require a magnetic deflector per se. Accordingly, the problems caused by the magnetic deflector in the prior art aberration correcting device, such as the focusing effect by the magnetic field of the magnetic deflector or the dispersion for electron beams comprising electrons with different energies, can be at least substantially avoided.

It is further noted, that U.S. Pat. No. 7,902,504 B2 describes a charged particle beam reflector device, which is configured to include at least two electrostatic mirrors arranged with a predetermined interval on a linear optical axis. Each of said two electrostatic mirrors having a through hole through which a charged particle beam which travels along said linear optical axis passes, and having a function of reflecting the charged particle beam or allowing the charged particle beam to pass through the through hole in accordance with an applied voltage. By applying a reflection voltage allowing the electrostatic mirrors to reflect the charged particle beam at a predetermined timing, the charged particle beam is reflected by the at least two electrostatic mirrors a plurality of times. Accordingly, the charged particle beam always travels along the optical axis, and the position where the charged particle beam is reflected by the electrostatic mirrors is also arranged on the optical axis. A chromatic and a spherical aberration can be corrected by the reflection of the first and second electrostatic mirrors.

A disadvantage of the charged particle beam reflector device of U.S. Pat. No. 7,902,504 B2 is, that the electrostatic mirrors need to be switched on and off in picosecond or nanosecond time intervals, which requires highly accurate and expensive electronics. In addition, the electron beam is emitted from the reflector device in a pulsed form with a predetermined cycle. These problems have been solved by the present invention by arranging the second mirror such that an incoming electron beam passes said second mirror at a position spaced apart from the position or area on the second mirror where the electron beam is deflected.

It is preferred that aberration correcting device of the present invention is arranged such that a trajectory of an incoming electron beam on its way toward the first mirror is positioned close to an edge of the second mirror. Accordingly, the first mirror needs to reflect the incoming electron beam over a small angle in order to direct the reflected electron beam onto the second mirror. In addition or alternatively, it is preferred that aberration correcting device of the present invention is arranged such that a trajectory of an outgoing electron beam on its way from the second mirror is positioned close to an edge of the first mirror. Accordingly, the second mirror needs to reflect the incoming electron beam over a small angle in order to direct the reflected electron beam to exit the aberration correcting device.

As already indicated above, the aberration correcting device of the present invention does not require a magnetic deflector per se. However, in an advantageous embodiment, the aberration correcting device further comprises a magnetic deflector which is arranged in said intermediate space, which magnetic deflector is configured for separating the incoming and reflected electron beam of said first and/or said second electron mirror. By arranging a magnetic deflector in said intermediate space, the first and/or second electron mirror can be configured as a retro-reflector. Within the context of this application, a retro-reflector is a device or surface that reflects a charged particle beam back along a direction parallel to but opposite in direction with respect to the incoming charged particle beam. In particular in case the first and/or second mirror act as a planar mirror, the incoming and reflected charged particle beam are arranged at least substantially perpendicular to said planar mirror. Accordingly the first and/or second mirror reflects the incoming electron beam over a substantially zero angle.

The reflected electron beam is separated from the incoming electron beam by the magnetic deflector. Preferably the magnetic deflector is configured to provide a magnetic field substantially perpendicular to a line connecting the first and second electron mirror, preferably connecting the centers of the first and second electron mirrors.

In an embodiment, the aberration correcting device comprises an input at the input side for introducing an electron beam into the aberration correcting device, wherein the input and the line connecting the first and second electron mirror define a plane, and wherein the magnetic deflector is configured to provide a magnetic field substantially perpendicular to said plane. In an embodiment, the aberration correcting device comprises an output at the output side, wherein the output is arranged in said plane. In use, the path of the electron beam through the aberration correcting device lies substantially in said plane. Because, at least in use, the magnetic field lines are arranged substantially perpendicular to said plane, the electron beams which traverse said magnetic field are deflected in said plane by the magnetic field.

In an embodiment, the aberration correcting device with the magnetic deflector further comprises an electrostatic deflector which is arranged in said intermediate space, which electrostatic deflector is configured to provide an electrostatic field which, in use, is arranged substantially perpendicular to the magnetic field of the magnetic deflector. In use, the electrostatic field is arranged substantially in the plane defined by the input and the line connecting the first and second electron mirror. Accordingly, the electrostatic field also deflects electron beams which traverse said electrostatic field, in said plane. Whereas the deflection direction of an electron beam in a magnetic field is dependent on the traveling direction of the electron beam, the deflection direction of an electron beam in an electrostatic field is substantially independent from the traveling direction of the electron beam. In the arrangement of this embodiment, the magnetic field and the electrostatic field can be arranged to provide a deflection in the same direction for an incoming electron beam, and provide a deflection in opposite direction for a back-reflected electron beam. Alternatively, the magnetic field and the electrostatic field can be configured to provide a deflection in opposite direction for an incoming electron beam, and to provide a deflection in the same direction for back-reflected electron beam.

In an embodiment, the magnetic deflector and the electrostatic deflector are configured to provide a substantially equal deflection angle to an electron beam which traverses said magnetic and electrostatic deflector. As already indicated above, the magnetic field and the electrostatic field can be configured to provide a deflection in the same direction for an incoming electron beam. In this case, the total deflection angle of the incoming electron beam is sum of the deflection angle of the magnetic deflector and the deflection angle of the electrostatic deflector, which is twice said substantial equal deflection angle. For the back-reflected electron beam which travels through the same combination of magnetic and electrostatic deflector, the total deflection angle of the reflected electron beam is the difference of the deflection angle of the magnetic deflector and the deflection angle of the electrostatic deflector, which is substantially zero. Alternatively, the magnetic field and the electrostatic field can be configured to provide a deflection in opposite direction for an incoming electron beam, and to provide a deflection in the same direction for back-reflected electron beam. In the situation in which the magnetic field and the electrostatic field are configured to provide a deflection in opposite direction, the magnetic field and the electrostatic field substantially cancel each other and the electron beam traverses said intermediate space substantially without being deflected.

In an embodiment, the magnetic deflector is a first magnetic deflector, wherein the aberration correcting device comprises a second magnetic deflector which is arranged between the first magnetic deflector and the first electron mirror.

In an embodiment, the first and second magnetic deflectors are configured to deflect an electron beam in opposite directions. According to this embodiment, two magnetic deflectors are arranged in series between the first and second mirror, and a deflection of the electron beam by said first magnetic deflector can at least partially be compensated by a deflection of the electron beam by said second magnetic deflector.

In an embodiment, the first and second magnetic deflectors are configured to deflect an electron beam over a substantially equal deflection angle. Accordingly, the trajectory of the electron beam after being deflected by both the first and second magnetic deflectors is substantially parallel to the trajectory of the incoming electron beam. The arrangement of the first and second magnetic deflectors according to this embodiment provides a substantially parallel shift of the traversing electron beams. The direction of said shift is defined by the direction in which the electrons in the electron beam are moving and the direction of the magnetic field.

Furthermore, the combination of a double deflection using two magnetic deflectors of equal but opposite strength displaces the electron beam while keeping the propagation direction substantially the same. This arrangement provides two free parameters; strength of deflection and distance between the magnetic deflectors. A careful selection of these two free parameters allows to make both the position and the direction of the electron beam substantially dispersion free.

In an embodiment, the at least one magnetic deflector is configured to deflect an incoming electron beam over an angle larger than 0 degrees and smaller than degrees, preferably smaller than 5 degrees. By configuring the magnetic deflector(s) to deflect an incoming electron beam over such a small angle, any focusing effect and/or dispersion is(are) substantially negligible and a deterioration of the resolution of the electron microscope is substantially prevented.

In particular the use of one or more magnetic deflectors in the intermediate space allows arranging, in an embodiment, the center line of the first electron mirror substantially parallel to the center line of the second electron mirror.

In a convenient and practical embodiment, said at least one of said first and second electron mirrors comprises a cylindrical symmetric electron mirror. Such electron mirrors are in particular advantageous when the electron mirrors are arranged such that the incoming electron beam is arranged at least substantially perpendicular to a reflecting side of said electron mirror and said electron mirror is configured to reflect the incoming electron beam over an angle of substantially zero degrees.

In an embodiment, one of said first and second electron mirrors is configured to provide a negative spherical aberration and/or a negative chromatic aberration to a reflected electron beam. Accordingly, these electron mirrors are configured for at least partially correcting the positive spherical and chromatic aberration of the electron lenses used in electron microscopes. In an embodiment, the other one of said first and second electron mirrors is configured to provide a substantially aberration-free reflection of an electron beam.

In an embodiment, one of said first and second electron mirrors is configured to provide a negative spherical aberration to a reflected electron beam, and wherein the other one of said first and second electron mirrors is configured to provide a negative chromatic aberration to a reflected electron beam. Accordingly, each one of the first and second electron mirrors is configured and/or optimized for correcting either a spherical aberration or a chromatic aberration.

In a practical embodiment, at least one of said first and second mirrors comprises an electrostatic mirror. In an embodiment, said electrostatic mirror comprises at least three electrodes, wherein two of said at least two electrodes are configured for transmitting an electron beam and for, in use, providing an electrostatic lens. In an embodiment, said aberration correcting device further comprises a controller or control circuit which is configured to provide a potential difference between said at least two electrodes in order to create a focus of a reflected electron beam substantially halfway between said first and second mirrors.

According to a second aspect, the invention provides an aberration correcting assembly comprising an aberration correcting device as described above, wherein the assembly further comprises a set of magnetic deflectors, wherein, at least in a traveling direction of an electron beam through said assembly, said set of magnetic deflectors is arranged upstream or downstream with respect to said aberration correcting device. In an embodiment, the individual magnetic deflectors of said set of magnetic deflectors are configured to deflect an electron beam in opposite directions. In an embodiment, the individual magnetic deflectors of said set of magnetic deflectors are configured to deflect an electron beam over a substantially equal deflection angle. On the one hand this additional set of magnetic deflectors provides a means for at least partially compensating a dispersion as provided by the magnetic deflectors in the intermediate space between the first and second electron mirror. On the other hand this additional set of magnetic deflectors provides a means for at least partially compensating a shift of the beam trajectory as provided by the aberration correcting device. Preferably the aberration correcting assembly is configured to provide an outgoing electron beam which is arranged along the same axis as the incoming electron beam. Accordingly, the aberration correcting assembly can be arranged in an electron microscope and provides an outgoing electron beam which is still on the central axis or electron-optical axis of said electron microscope.

According to a third aspect, the invention provides an electron microscope comprising an electron-optical column comprising electron optical elements for projecting an electron beam from an electron source onto a target, wherein the electron microscope comprises an aberration correcting device as described above or an aberration correcting assembly as described above.

In an embodiment, the electron-optical column comprises an optical axis, and wherein the center line of the first electron mirror and/or the center line of the second electron mirror are arranged substantially parallel to the optical axis.

In an embodiment, at least one of said first and second mirrors comprises an electrostatic mirror comprising two or more electrodes, wherein a controller is configured for setting and/or adjusting the potentials of the electrodes of the electrostatic mirror.

In an embodiment, said controller is connected to said electrostatic mirror for setting and/or adjusting a correcting aberration of said at least one of said first and second electron mirrors, and/or a magnification between the aberration correcting device and a final focusing lens of the electron optical column.

In an embodiment, the electron microscope comprises an electron accelerator having an input side and an exit side, wherein the electron accelerator is configured for accelerating electrons from the input side towards the exit side, wherein the aberration correcting device is arranged at the input side of said electron accelerator. Accordingly the aberration correcting device is preferably arranged in a part of the electron microscope where, in use, the electrons have a relatively low energy. After the aberration correcting device has provided the desired compensation for spherical and/or chromatic aberration, the energy of the electrons can be increased to the desired level by means of the electron accelerator.

In an embodiment, the electron microscope comprises an electron decelerator having an input side and an exit side, wherein the electron decelerator is configured for decelerating electrons from the input side towards the exit side, wherein the aberration correcting device is arranged at the exit side of said electron decelerator. Again, the aberration correcting device is preferably arranged in a part of the electron microscope where, in use, the electrons have a relatively low energy. If, however, the electrons in the electron microscope already have a high energy, it is preferred to decrease the energy of the electrons to a desired level by means of the electron decelerator. After the electron decelerator has decreased the energy of the electrons to the sired level, the aberration correcting device can provided the desired compensation for spherical and/or chromatic aberration.

According to a fourth aspect, the invention provides a method of operating an electron microscope as described above, wherein the first and/or second mirror of said aberration correcting device are configured to at least partially counteract aberrations of one or more of said electron optical elements in the electron microscope.

In an embodiment, at least one of said first and second mirrors comprises an electrostatic mirror comprising two or more electrodes, wherein a controller is configured for setting and/or adjusting the potentials of the electrodes of the electrostatic mirror, wherein the potentials of the electrodes of said electrostatic mirror are adjusted to at least partially counteract the aberrations of one or more of said electron optical elements in the electron microscope.

In an embodiment, said controller sets and/or adjusts the potentials of the electrodes of the electrostatic mirror for setting and/or adjusting the correcting aberration of said at least one of said first and second electron mirrors, and/or the magnification between the aberration correcting device and a final focusing lens of the electron optical column.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
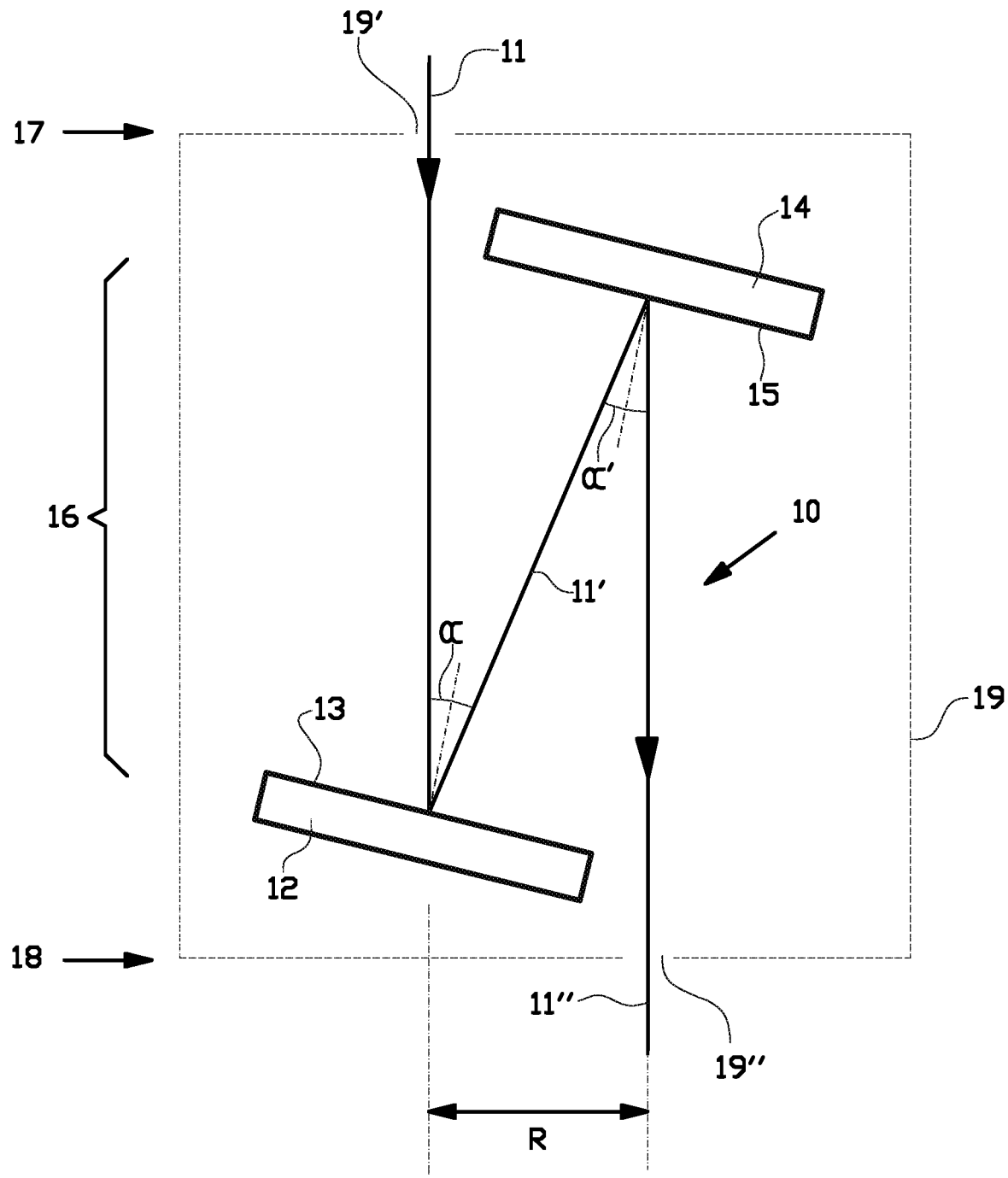
FIG. 1 shows a schematic cross section of a first example of an aberration correcting device according to the invention.

FIG. 1 shows a schematic cross section of a first example of an aberration correcting device 10 for correcting aberrations of an incoming electron beam 11, for example an electron beam form an electron microscope. The aberration correcting device comprises a first electron mirror 12 and a second electron mirror 14, each comprising an electron beam reflecting face 13, 15. In between said first and second electron mirrors an intermediate space 16 is arranged, wherein the intermediate space comprises a input side 17 for inputting the electron beam 11 into the intermediate space 16, and an exit side 18 for exiting the electron beam 11" out of the intermediate space 16. As illustrated in FIG. 1, the first electron mirror 12 is arranged at the exit side 18 and is arranged to receive the electron beam 11 coming from the input side 17 and to reflect the electron beam 11' via the intermediate space 16 towards the second electron mirror 14. The second electron mirror 14 is arranged at the input side 17 and is arranged to receive the electron beam 11' coming from the first electron mirror 12 and to reflect the electron beam 11" via the intermediate space 16 towards the exit side 18. Accordingly, the first and second electron mirrors are arranged at opposite sides of the intermediate space 16, and the reflective face 13 of the first electron mirror 12 and the reflective face 15 of the second electron mirror 14 are arranged to face said intermediate space 16.

The Aberration correcting device 10 is configured such that the second electron mirror 14 receives the electron beam 11' at a reflection position on the second mirror 14, which reflection position is arranged at a distance R from the incoming electron beam 11. Accordingly, the incoming electron beam 11 passes said second mirror 14 at a position spaced apart from the reflection position on the second mirror 14.

Furthermore, at least one of said first electron mirror 12 and second electron mirror 14 is arranged to provide a correcting aberration to a reflected electron beam 11', 11". In an electron mirror, the electrons are decelerated to reflect on an equipotential plane where the kinetic energy of the electrons reaches zero. The equipotential plane where the kinetic energy of individual electrons reaches zero thus provides the reflective face of these electrons. By curving this equipotential plane, it is possible to introduce negative spherical and chromatic aberration into the reflected electron beam which can be arranged to at least partially compensate the aberrations of the electron microscope lenses.

As shown in FIG. 1, the first electron mirror is arranged to reflect the incoming electron beam 11 over an angle α, and the second electron mirror 14 is arranged to reflect the incoming electron beam 11' over an angle α'. In the example shown in FIG. 1 the angle α is substantially equal to the angle α'. Accordingly the beam path of the outgoing electron beam 11" is substantially parallel to the beam path of the incoming electron beam 11, but is shifted over a distance R in a direction transverse to the beam path of the incoming electron beam 11.

The incoming electron beam 11 passes close to the second electron mirror 15, and the outgoing electron beam 11" passes close to the first electron mirror 12. As the enclosed FIG. 1 is not to scale, a typical distance between the second electron mirror 14 and the incoming electron beam 11 is 1 mm or less. The typical distance between the first electron mirror 12 and the outgoing electron beam 11" is also 1 mm or less. Combined with a distance between the first electron mirror 12 and the second electron mirror 14 of 15 mm, for example, the angle α is in the range of 4 to 10 degrees. Accordingly the outgoing electron beam 11" is shifted over a distance R in a range of 2 to 4 mm, for example. It is noted that the angle α may even be smaller than 4 degrees and the distance R may be smaller than 2 mm when the distance between the first electron mirror 12 and the second electron mirror 14 is larger than 15 mm.

As schematically indicated in FIG. 1, the aberration correcting device 10 is preferably arranged in a housing 19 comprising an input 19' at said input side 17 and an output 19" at said output side 18.

Figure 2:
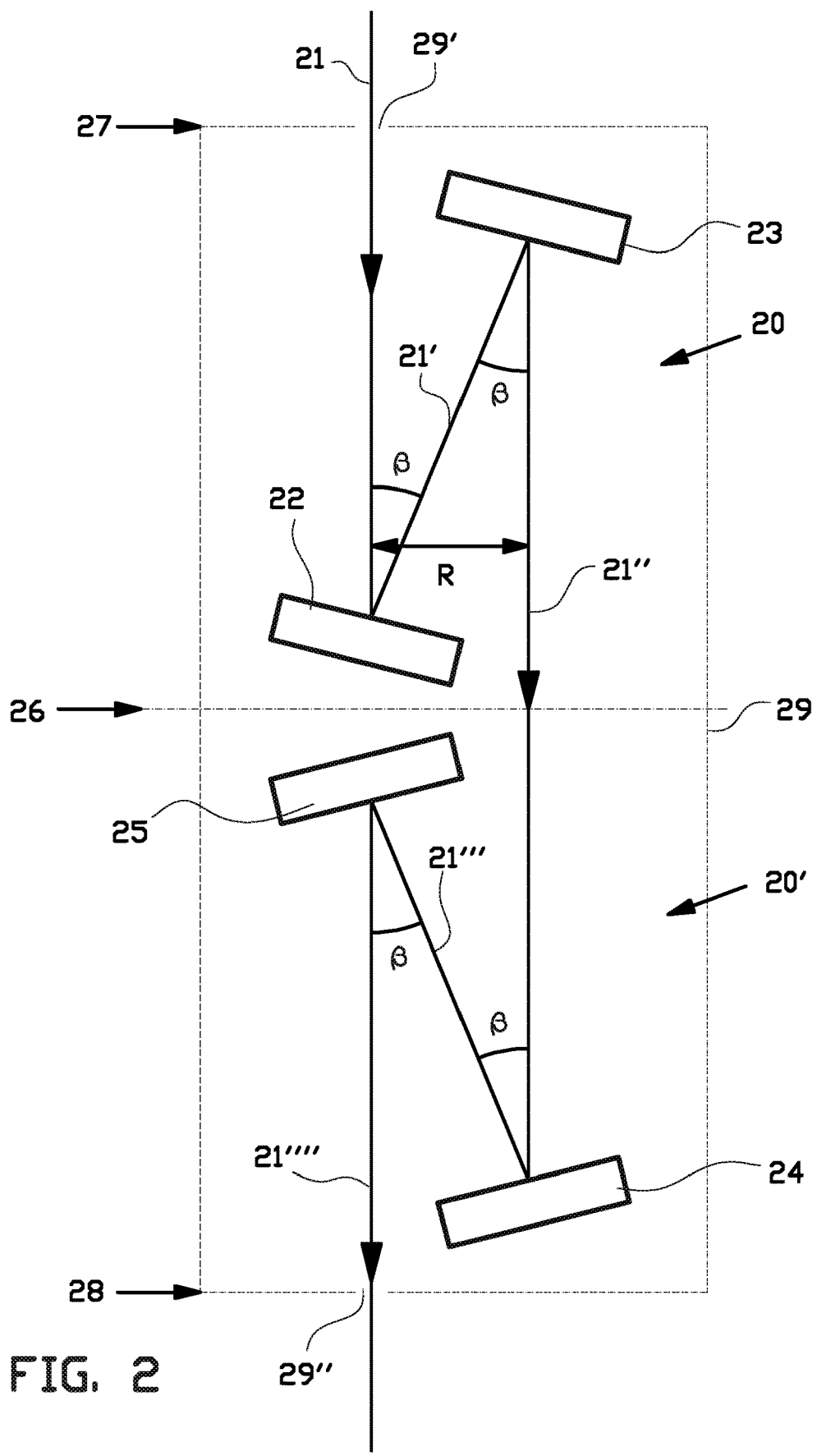
FIG. 2 shows a schematic cross section of a second example of an aberration correcting assembly according to the invention.

FIG. 2 shows a schematic cross section of a second example of an aberration correcting assembly according to the invention, in which two aberration correcting devices 20, 20' have been arranged in series. Each of the aberration correcting devices 20, 20' is substantially the same as the aberration correcting device 10 as described above with reference to FIG. 1. The first aberration correcting device 20 of the assembly comprises a first electron mirror 22 and a second electron mirror 23. The second aberration correcting device 20' of the assembly comprises a third electron mirror 24 and a fourth electron mirror 25. As illustrated in FIG. 2, the first electron mirror 22 is at or near a center 26 of the assembly and is arranged to receive the electron beam 11 coming from the input side 27 and to reflect the electron beam 21' towards the second electron mirror 23. The second electron mirror 23 is arranged at the input side 27 of the assembly and is arranged to receive the electron beam 21' coming from the first electron mirror 22 and to reflect the electron beam 21" towards the third electron mirror 24. The third electron mirror 24 is arranged at the output side 28 of the assembly and is arranged to receive the electron beam 21" from the second electron mirror 23 and to reflect the electron beam 21'" towards the fourth electron mirror 25. The fourth electron mirror 25 is arranged at or near the center 26 of the assembly and is arranged to receive the electron beam 21'" from the third electron mirror 24 and to reflect the electron beam 21"" towards the output side 28.

The first aberration correcting device 20 is configured such that the second electron mirror 23 receives the electron beam 21' at a reflection position on the second mirror 23, which reflection position is arranged at a distance R from the incoming electron beam 21. Accordingly, the incoming electron beam 21 passes said second mirror 23 at a position spaced apart from the reflection position on the second mirror 23. In addition, the fourth electron mirror 25 receives the electron beam 21'" at a reflection position on said fourth mirror 25, which reflection position is arranged at a distance R from the incoming electron beam 21". Accordingly, the incoming electron beam 21" passes said fourth mirror 25 at a position spaced apart from the reflection position on the fourth mirror 25.

Again, at least one of said first, second, third and fourth electron mirrors 22, 23, 24, 25 is arranged to provide a correcting aberration to a reflected electron beam 21', 21", 21'", 21"". As shown in FIG. 2, the first, second, third and fourth electron mirrors 22, 23, 24, 25 are all arranged to reflect the incoming electron beam substantially the same angle β. Accordingly the beam path of the electron beam 21" after the first aberration correcting device 20 at the centre 26 of the assembly is substantially parallel to the beam path of the incoming electron beam 21, but is shifted over a distance R in a direction transverse to the beam path of the incoming electron beam 21. As shown in FIG. 2, the second aberration correcting device 20' is arranged as a substantially mirror symmetrical copy of the first aberration correcting device 20, wherein the centre 26 acts as a mirror plane. The second aberration correcting device 20' also provides a shift of the beam path over a distance R, but now in opposite direction. The result is that the outgoing electron beam 21"" of the assembly is at least substantially in line with the incoming electron beam 21.

As schematically indicated in FIG. 2, the aberration correcting assembly is preferably arranged in a housing 29 comprising an input 29' at said input side 27 and an output 29" at said output side 28.

Figure 3:
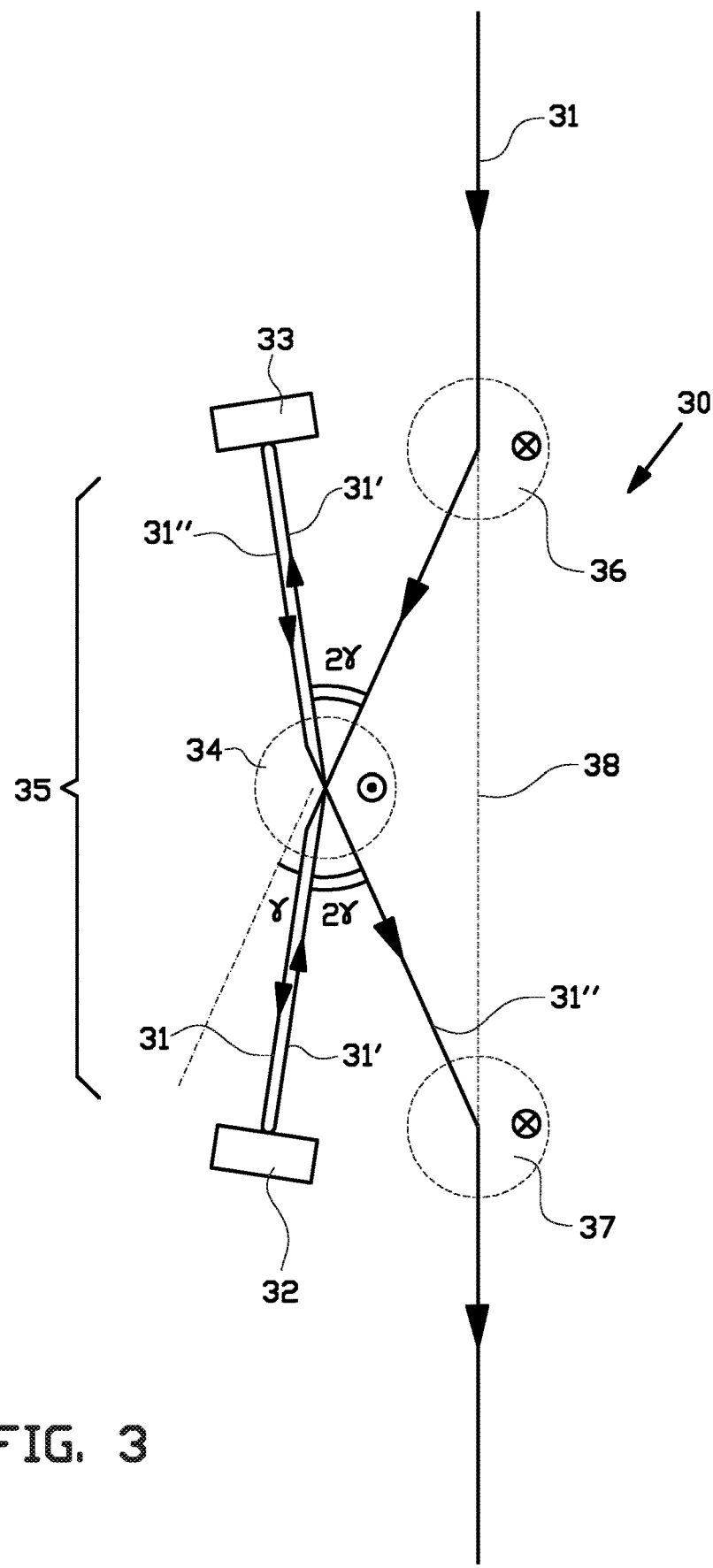
FIG. 3 shows a schematic cross section of a third example of an aberration correcting assembly according to the invention.

FIG. 3 shows a schematic cross section of a third example of an aberration correcting assembly 30. The aberration correcting assembly 30 comprises a first magnetic deflector 36, which is arranged to direct an incoming electron beam 31 towards a second magnetic deflector 34 arranged in the intermediate space 35. The second magnetic deflector 34 is arranged in between a first electron mirror 32 and a second electron mirror 33. At least one of said first electron mirror 32 and second electron mirror 33 is arranged to provide a correcting aberration to a reflected electron beam 31', 31". The second magnetic deflector 34 is arranged to provide a magnetic field in a direction substantially perpendicular to the cross section view of FIG. 3, towards the viewer. As schematically shown in FIG. 3, the reflecting surfaces of the first electron mirror 32 and the second electron mirror 33 are facing the second magnetic deflector 34.

After being deflected by the first magnetic deflector 36, an incoming electron beam 31, traverses said second magnetic deflector 34 is deflected over an angle γ and is directed towards the first electron mirror 32. The first electron mirror 32 is arranged to reflect the reflected electron beam 31' back along substantially the same direction as the incoming electron beam 31. When the reflected electron beam 31' traverses the second magnetic deflector 34, the reflected electron beam 31' is again deflected over an angle γ and is directed towards the second electron mirror 33. Accordingly, and as indicated in FIG. 3, the second magnetic deflector 34 separates the reflected electron beam 31' from the incoming electron beam 31. The angle between the reflected electron beam 31' after deflection by the second magnetic deflector 34 and the incoming electron beam 31 is substantially 2 times the angle β.

The second electron mirror 33 is arranged to reflect the double reflected electron beam 31" back along substantially the same direction as the reflected electron beam 31'. When the double reflected electron beam 31" traverses the second magnetic deflector 34, the double reflected electron beam 31" is again deflected over an angle γ and is directed past the first electron mirror 32 towards a third magnetic deflector 37. Accordingly and as indicated in FIG. 3, the second magnetic deflector 34 separates the double reflected electron beam 31" from the reflected electron beam 31'. The angle between the double reflected electron beam 31" after deflection by the second magnetic deflector 34 and the reflected electron beam 31' is substantially 2 times the angle γ.

At the third magnetic deflector 37 the double reflected electron beam 31" is deflected to arrange the outgoing, double reflected electron beam 31" in a direction along the central axis 38. The result is that the outgoing electron beam 31" of the assembly 30 is at least substantially in line with the incoming electron beam 31.

As schematically indicated in FIG. 3, the incoming electron beam 31 passes close to the second electron mirror 33, and the double reflected electron beam 31" passes close to the first electron mirror 32. As the enclosed FIG. 3 is not to scale, a typical distance between the second electron mirror 33 and the incoming electron beam 31 is 1 mm or less. Combined with a distance between the second electron mirror 33 and the magnetic deflector 34 of 10 mm, for example, the angle γ is in the range of 5 to 10 degrees. It is noted that the angle γ may even be smaller than 5 degrees when the distance between the second electron mirror 33 and the magnetic deflector 34 is larger than 10 mm.

It is noted that the aberration correcting device is configured such that the second electron mirror 33 receives the electron beam 31' at a reflection position on the second mirror 33, which reflection position is arranged spaced apart from the incoming electron beam 31.

As further schematically indicated in FIG. 3, the first magnetic deflector 36 is arranged at or near the input side of the aberration correcting device 30, and the third magnetic deflector 37 is arranged at or near the output side of the aberration correcting device 30. In this example the first magnetic deflector 36 is arranged adjacent to the second electron mirror 33, and the third magnetic deflector 37 is arranged adjacent the first electron mirror 32.

Figure 4:
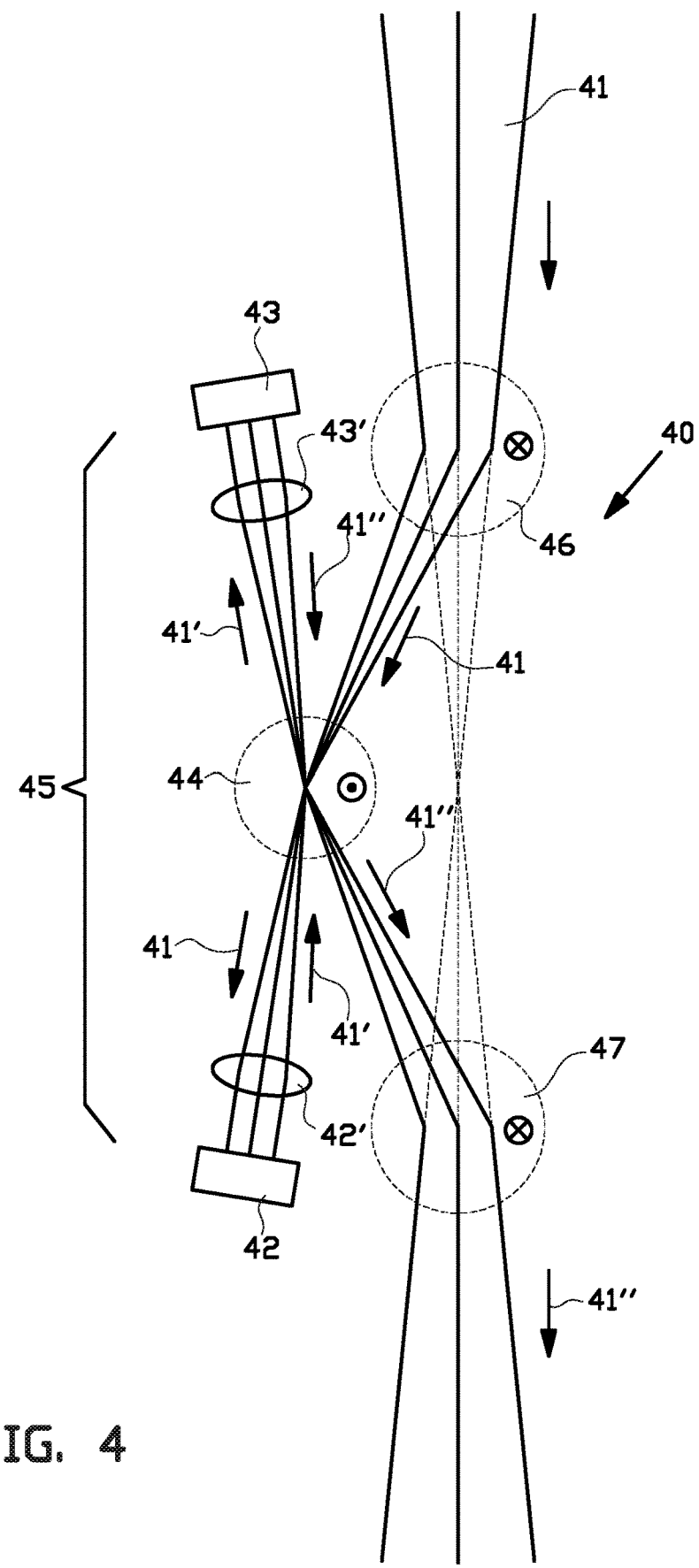
FIG. 4 shows a schematic cross section of a fourth example of an aberration correcting device according to the invention.

FIG. 4 shows a schematic cross section of a fourth example of an aberration correcting device 40 according to the invention. The aberration correcting device 40 according to this example is, to a large extend, the same as the third example as described above with reference to FIG. 3.

As discussed above, the equipotential plane where the kinetic energy of electrons reaches zero provides the reflective face of these electrons. By curving this equipotential plane, it is possible to introduce negative spherical and chromatic aberration into the reflected electron beam. One way to obtain curved equipotential planes is to combine an electron mirror 42, 43 with an electron lens 42', 43' such that the curved equipotential planes of the lens also act as reflective faces for electrons. Such a combination can be arranged to provide curved equipotential planes suitable for at least partially compensating the aberrations of the electron microscope lenses. Accordingly and as indicated in FIG. 4, a first electron lens 42' is arranged in front of the first electron mirror 42, and a second electron lens 43' is arranged in front of the second electron mirror 43.

As schematically shown in FIG. 4, the electron lenses 42', 43' are arranged to provide a focus of the electron beam substantially halfway between the first electron mirror 42 and the second electron mirror 43. In use, the incoming electron beam 41 is arranged to converge at a focal point substantially at the same position substantially halfway between the first electron mirror 42 and the second electron mirror 43. The incoming electron beam 41 can be arranged to converge by the optics of the electron microscope, and/or the aberration correcting device 40 can be provided with an additional electron lens (not shown). Just as explained above in the third example, the incoming electron beam 41 traverses the first magnetic deflector 46, the second magnetic deflector 44, and is directed towards the assembly of the first electron lens 42' and first electron mirror 42. The assembly of the first electron lens 42' and first electron mirror 42 is arranged to reflect the reflected electron beam 41' back along substantially the same path as the incoming electron beam after the second magnetic deflector 44. The reflected electron beam 41' traverses the second magnetic deflector 44, and is focused substantially halfway between the first electron mirror 42 and the second electron mirror 43. Subsequently the reflected electron beam 41' is directed towards the assembly of the second electron lens 43' and second electron mirror 43. The assembly of the second electron lens 43' and second electron mirror 43 is arranged to reflect the double reflected electron beam 41" back along substantially the same path as the reflected electron beam 41' after the second magnetic deflector 44. The double reflected electron beam 41" traverses the second magnetic deflector 44, and is focused substantially halfway between the first electron mirror 42 and the second electron mirror 43. After the second magnetic deflector 44 the double reflected electron beam 41" travels towards the third magnetic deflector 47 which is arranged to deflect the double reflected electron beam 41" in a direction at least substantially in line with the incoming electron beam 41. As schematically indicated in FIG. 4, the double reflected electron beam 41" is a diverging electron beam. Accordingly the optics of the electron microscope can be arranged to further handle this diverging electron beam, and/or the aberration correcting device 40 can be provided with an additional electron lens (not shown).

It is noted that the aberration correcting device is configured such that the second electron mirror 43 receives the electron beam 41' at a reflection position on the second mirror 43, which reflection position is arranged spaced apart from the incoming electron beam 41.

It is further noted that just as FIG. 3, figure is not to scale in order to more clearly show the features of the aberration correcting device 40. In particular, the horizontal scale in FIG. 4 is different from the vertical scale. The actual dimensions of the aberration correcting device 40 according to this fourth example may be comparable to the dimensions presented above in the third example.

Figure 5:
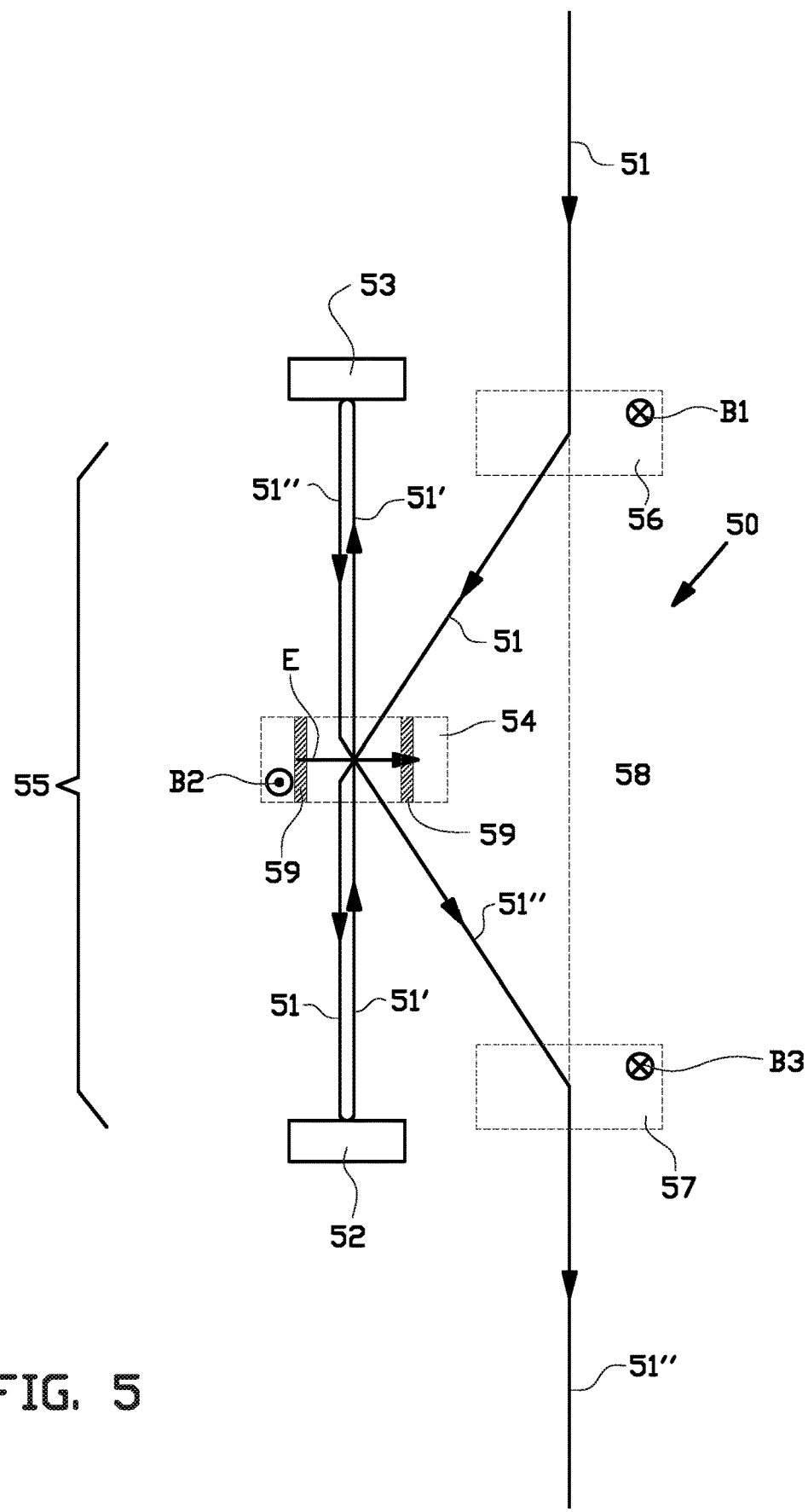
FIG. 5 shows a schematic cross section of a fifth example of an aberration correcting device according to the invention.

FIG. 5 shows a schematic cross section of a fifth example of an aberration correcting assembly 50. The aberration correcting assembly 50 comprises a first magnetic deflector 56, which is arranged to direct an incoming electron beam 51 towards an assembly comprising a second magnetic deflector 54 and an electromagnetic deflector 59 arranged in the intermediate space 55. The assembly of the second magnetic deflector 54 and the electromagnetic deflector 59 is arranged in between a first electron mirror 52 and a second electron mirror 53. At least one of said first electron mirror 52 and second electron mirror 53 is arranged to provide a correcting aberration to a reflected electron beam 51', 51". The second magnetic deflector 54 is arranged to provide a magnetic field in a direction substantially perpendicular to the cross section view of FIG. 5, towards the viewer. The electromagnetic deflector 59 is arranged to provide an electrostatic field in a direction substantially perpendicular to the magnetic field, and substantially perpendicular to the central axis 58. As schematically shown in FIG. 5, the reflecting surfaces of the first electron mirror 52 and the second electron mirror 53 are facing the assembly of the second magnetic deflector 54 and the electrostatic deflector 59.

After being deflected by the first magnetic deflector 56, an incoming electron beam 51 is directed to said assembly comprising the second magnetic deflector 54 and the electrostatic deflector 59. In the example shown in FIG. 5, the second magnetic deflector 54 and the electrostatic deflector 59 are arranged to provide a substantially equal deflection angle to an electron beam which traverses said assembly. The magnetic field B2 and the electrostatic field E are arranged to provide a deflection in the same direction for an incoming electron beam 51, so the total deflection angle of the incoming electron beam 51 is sum of the deflection angle of the second magnetic deflector 54 and the deflection angle of the electrostatic deflector 59, which is twice said substantial equal deflection angle. Subsequently, the deflected electron beam 51 is directed towards the first electron mirror 52. The first electron mirror 52 is arranged to reflect the reflected electron beam 51' back along substantially the same direction as the incoming electron beam 51.

When the reflected electron beam 51' traverses the assembly of the second magnetic deflector 54 and the electrostatic deflector 59, the electrostatic field E provides a deflection in opposite direction with respect to the deflection as provided by the magnetic field B2. Accordingly, the total deflection angle of the reflected electron beam 51' is the difference of the deflection angle of the second magnetic deflector 54 and the deflection angle of the electrostatic deflector 59, which results in a deflection over an angle which is substantially zero. Accordingly, and as indicated in FIG. 5, the assembly of the second magnetic deflector 54 and the electrostatic deflector 59 separates the reflected electron beam 51' from the incoming electron beam 51.

The second electron mirror 53 is arranged to reflect the double reflected electron beam 51" back along substantially the same direction as the reflected electron beam 51'. When the double reflected electron beam 51" traverses the assembly comprising the second magnetic deflector 54 and the electrostatic deflector 59, the magnetic field B2 and the electrostatic field E again provide a deflection in the same direction, so the total deflection angle of the double reflected electron beam 51" is sum of the deflection angle of the second magnetic deflector 54 and the deflection angle of the electrostatic deflector 59, which is twice said substantial equal deflection angle. Subsequently, the double reflected electron beam 51" is again deflected over an angle and is directed towards a third magnetic deflector 57. Accordingly and as indicated in FIG. 5, the assembly of the second magnetic deflector 54 and the electrostatic deflector 59 separates the double reflected electron beam 51" from the reflected electron beam 51'.

At the third magnetic deflector 57 the double reflected electron beam 51" is deflected to arrange the outgoing, double reflected electron beam 51" in a direction along the central axis 58. The result is that the outgoing electron beam 51" of the assembly 50 is at least substantially in line with the incoming electron beam 51.

It is noted that the aberration correcting device is configured such that the second electron mirror 53 receives the electron beam 51' at a reflection position on the second mirror 53, which reflection position is arranged spaced apart from the incoming electron beam 51.

It is further noted that the enclosed FIG. 5 is not to scale; a typical distance between the second electron mirror 53 and the incoming electron beam 51 is 1 mm or less. Combined with a distance between the second electron mirror 53 and the first electron mirror 52 of 20 mm, for example, the deflection angle is small, preferably smaller than 5 degrees.

It is noted that in FIGS. 3 and 5, the deflected electron beam 31, 51, and the reflected electron beam 31', 51' are schematically indicated as two separate adjacent trajectories between the second magnetic deflector 34, 54 and the first electron mirror 32, 52. However, in practice these trajectories can be very close to each other or even substantially overlapping, as schematically indicated with the deflected electron beam 41, 61 and the reflected electron beam 41', 61' in FIGS. 4 and 6. The same schematic indication is also used for the reflected electron beam 31', 51' and the double reflected electron beam 31", 51" between the second magnetic deflector 34, 54 and the second electron mirror 33, 53 in FIGS. 3 and 5.

Figure 6:
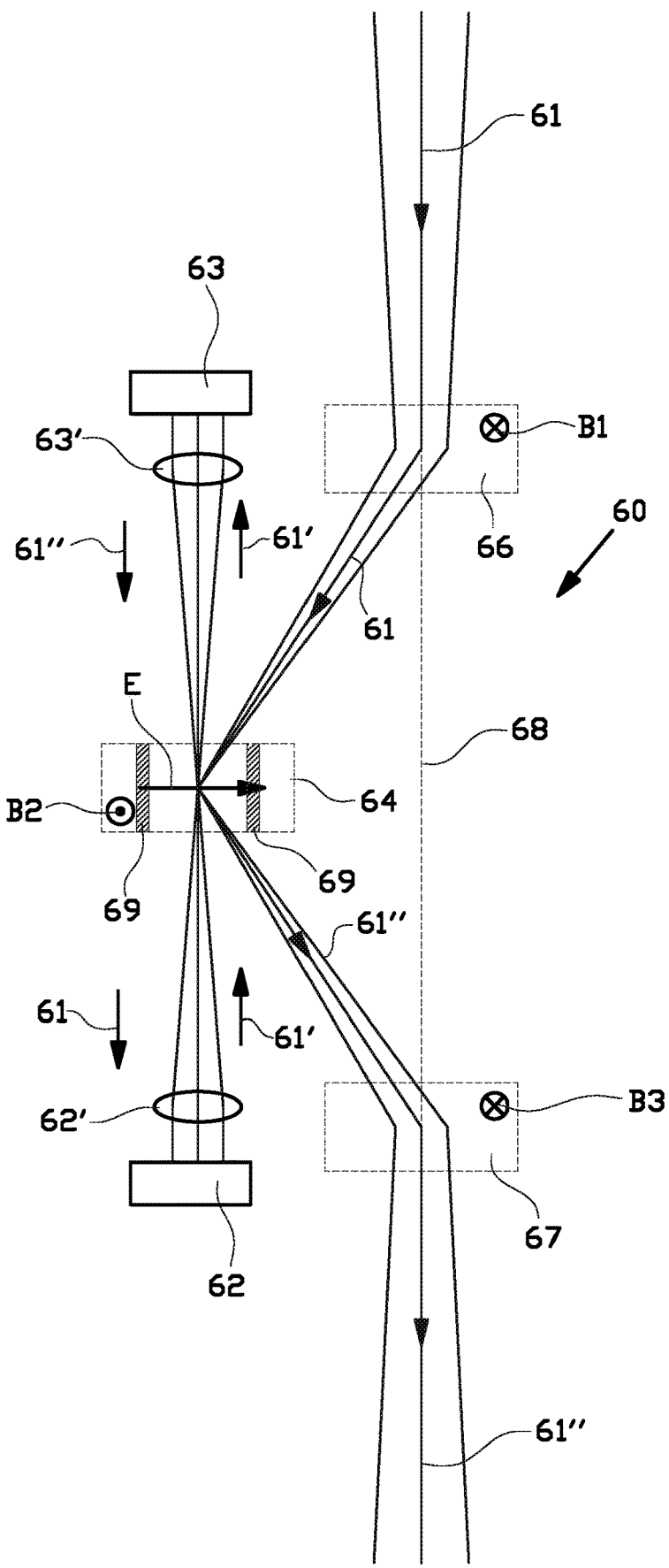
FIG. 6 shows a schematic cross section of a sixth example of an aberration correcting device according to the invention.

FIG. 6 shows a schematic cross section of a sixth example of an aberration correcting device 60 according to the invention. The aberration correcting device 60 according to this example is, to a large extend, the same as the fifth example as described above with reference to FIG. 5.

As indicated in FIG. 6, a first electron lens 62' is arranged in front of the first electron mirror 62, and a second electron lens 63' is arranged in front of the second electron mirror 63. The electron lenses 62', 63' are arranged to provide a focus of the electron beam substantially halfway between the first electron mirror 62 and the second electron mirror 63. In use, the incoming electron beam 61 is arranged to converge at a focal point substantially at the same position substantially halfway between the first electron mirror 62 and the second electron mirror 63. The incoming electron beam 61 can be arranged to converge by the optics of the electron microscope, and/or the aberration correcting device 60 can be provided with an additional electron lens (not shown). Just as explained above in the fifth example, the incoming electron beam 61 traverses the first magnetic deflector 66 and is directed towards an assembly comprising the second magnetic deflector 64 and an electrostatic deflector 69. The working of the assembly of the second magnetic deflector 64 and the electrostatic deflector 69 is the same as discussed above with reference to the fifth example.

Subsequently the incoming electron beam 61 is deflected by the assembly of the second magnetic deflector and the electrostatic deflector 69 and is directed towards the assembly of the first electron lens 62' and first electron mirror 62. The assembly of the first electron lens 62' and first electron mirror 62 is arranged to reflect the reflected electron beam 61' back along substantially the same path as the incoming electron beam 61 towards the assembly of the second magnetic deflector 64 and the electrostatic deflector 69 and is focused substantially halfway between the first electron mirror 62 and the second electron mirror 63.

The reflected electron beam 61' traverses the assembly of the second magnetic deflector 64 and the electrostatic deflector 69. However, for the reflected electron beam 61' the deflection by the magnetic field B2 is cancelled out by the deflection by the electrostatic field E. Accordingly the reflected electron beam 61' is not deflected at the assembly of the second magnetic deflector and the electrostatic deflector 69 and travels substantially straight through said assembly towards the assembly of the second electron lens 63' and second electron mirror 63. The assembly of the second electron lens 63' and second electron mirror 63 is arranged to reflect the double reflected electron beam 61" back along substantially the same path as the reflected electron beam 61' back to assembly of the second magnetic deflector 64 and the electrostatic deflector 69. The double reflected electron beam 61" traverses the assembly of the second magnetic deflector 64 and the electrostatic deflector 69, and is focused substantially halfway between the first electron mirror 62 and the second electron mirror 63.

The double reflected electron beam 61" again traverses the assembly of assembly of the second magnetic deflector 64 and the electrostatic deflector 69. For the double reflected electron beam 61" the deflection of the magnetic field B2 and the deflection by the electrostatic field add up, and the double reflected electron beam 61" is deflected towards the third magnetic deflector 67. The third magnetic deflector 67 is arranged to deflect the double reflected electron beam 61" in a direction substantially along the central axis 68, at least substantially in line with the incoming electron beam 61. As schematically indicated in FIG. 6, the double reflected electron beam 61" is a diverging electron beam. Accordingly the optics of the electron microscope can be arranged to further handle this diverging electron beam, and/or the aberration correcting device 60 can be provided with an additional electron lens (not shown).

It is noted that the aberration correcting device 60 is configured such that the second electron mirror 63 receives the electron beam 61' at a reflection position on the second mirror 63, which reflection position is arranged spaced apart from the incoming electron beam 61.

It is further noted that just as FIG. 5, FIG. 6 is not to scale in order to more clearly show the features of the aberration correcting device 60. In particular, the horizontal scale in FIG. 6 is different from the vertical scale. The actual dimensions of the aberration correcting device 60 according to this sixth example may be comparable to the dimensions presented above in the fifth example.

Figure 7:
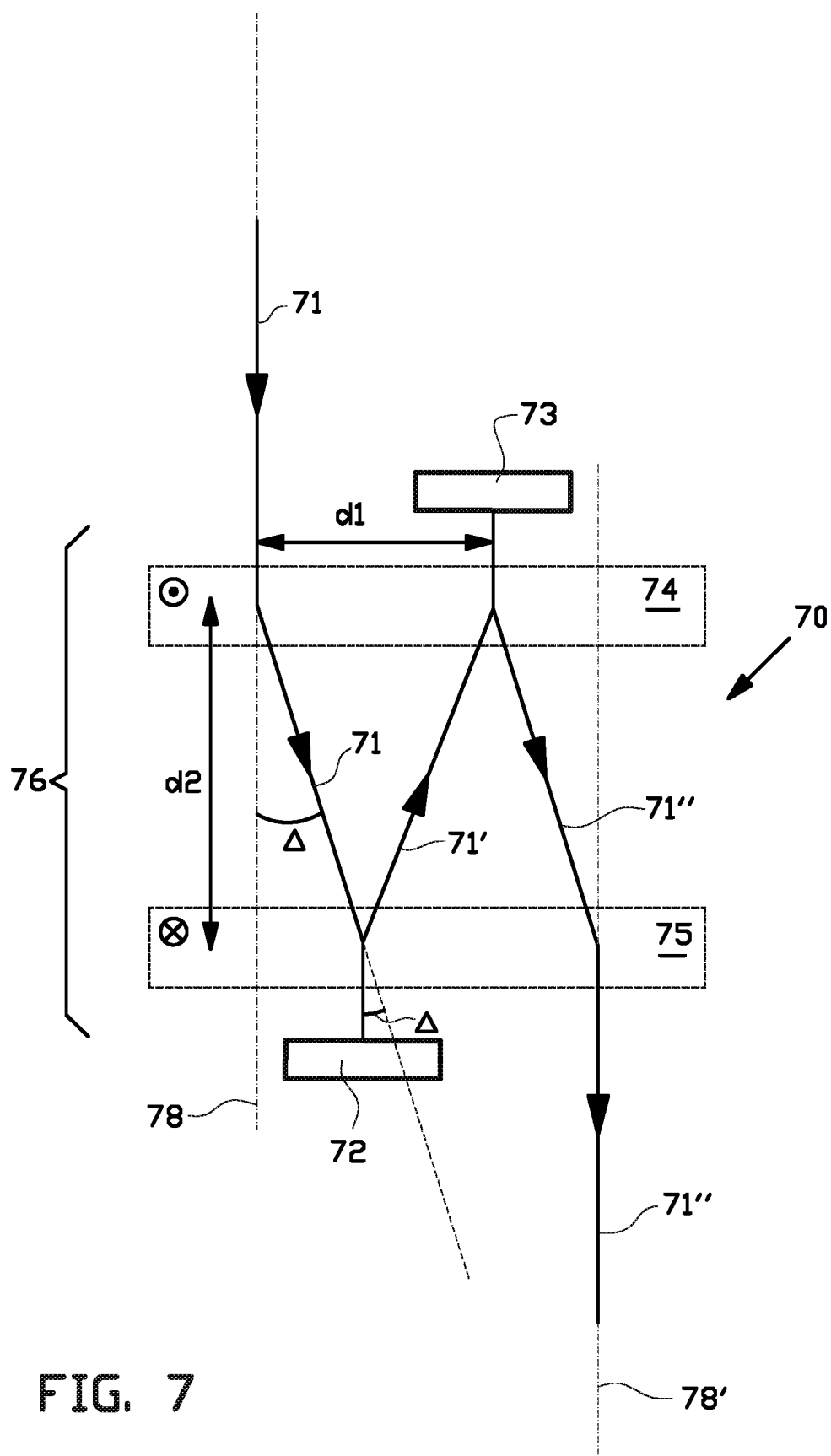
FIG. 7 shows a schematic cross section of a seventh example of an aberration correcting assembly according to the invention.

In a seventh example of an aberration correcting device 70 according to the invention, as shown in FIG. 7, the aberration correcting device 70 comprises a first electron mirror 72 and a second electron mirror 73. At least one of said first electron mirror 72 and second electron mirror 73 is arranged to provide a correcting aberration to a reflected electron beam 71', 71". In between said first and second electron mirrors two magnetic deflectors 74, 75 are arranged in an intermediate space 76. A first magnetic deflector 74 is arranged near the second electron mirror 73, and a second magnetic deflector 75 is arranged between the first magnetic deflector 74 and the first electron mirror 72, preferably near the first electron mirror 72.

The first magnetic deflector 74 is arranged to provide a magnetic field in a direction substantially perpendicular to the cross section view of FIG. 7, and towards the viewer (indicated by ⊙). The second magnetic deflector 75 is arranged to provide a magnetic field in a direction substantially perpendicular to the cross section view of FIG. 7, and away from the viewer (indicated by ⊗). Accordingly, the first and second magnetic deflectors 74, 75 are arranged to deflect an electron beam 71 in opposite directions.

As schematically indicated in FIG. 7, the first and second magnetic deflectors 74, 75 are arranged to provide a magnetic field which extend in a direction substantially perpendicular to the central axis 78 so that the incoming electron beam 71, the reflected electron beam 71' and the double reflected electron beam 71" all traverse the magnetic field of each of said first and second magnetic deflectors 74, 75. In addition the first and second magnetic deflectors 74, 75 are arranged to deflect an electron beam over a substantially equal deflection angle Δ.

An incoming electron beam 71 which enters the aberration correcting device 70 along a central axis 78, traverses the first magnetic deflector 74 and is deflected over an angle Δ to the left as viewed in the propagation direction of said electron beam 71 and is directed towards the second magnetic deflector 75. Subsequently the incoming electron beam 71 traverses the second magnetic deflector 75 and is deflected over an angle Δ to the right as viewed in the propagation direction of said electron beam 71 and is directed towards the first electron mirror 72. After the second magnetic deflector 75 the incoming electron beam 71 travels in a direction substantially parallel to the central axis 78. The first electron mirror 72 is arranged to reflect the reflected electron beam 71' back along substantially the same path as the incoming electron beam 71 after the second magnetic deflector 75.

The reflected electron beam 71' traverses the second magnetic deflector 75 and is deflected over an angle Δ to the right as viewed in the propagation direction of said reflected electron beam 71' and is directed towards the first magnetic deflector 74. Subsequently the reflected electron beam 71' traverses the first magnetic deflector 74 and is deflected over an angle Δ to the left as viewed in the propagation direction of said reflected electron beam 71' and is directed towards the second electron mirror 73. After the first magnetic deflector 74 the reflected electron beam 71' travels in a direction substantially parallel to the central axis 78. The second electron mirror is arranged to reflect the double reflected electron beam 71" back along substantially the same path as the reflected electron beam 71' after the first magnetic deflector 74.

The double reflected electron beam 71" traverses the first magnetic deflector 74 is deflected over an angle Δ to the left as viewed in the propagation direction of said double reflected electron beam 71" and is directed towards the second magnetic deflector 75. Subsequently the double reflected electron beam 71" traverses the second magnetic deflector 75 and is deflected over an angle Δ to the right as viewed in the propagation direction of said electron beam 71 and is directed past the first electron mirror 72 in order to exit the aberration correcting device 70. After the second magnetic deflector 75 the double reflected electron beam 71" travels along the axis 78' in a direction substantially parallel to the central axis 78.

It is noted that the aberration correcting device is configured such that the second electron mirror 73 receives the electron beam 71' at a reflection position on the second mirror 73, which reflection position is arranged at a distance dl from the incoming electron beam 71. Accordingly the incoming electron beam 71 is arranged spaced apart from the reflection position on the second electron mirror 73.

It is further noted that the FIG. 7 is not to scale in order to more clearly show the features of the aberration correcting device 70. In particular, the horizontal scale in FIG. 7 is different from the vertical scale. For example the distance d1 between the incoming electron beam 71 and the reflected electron beam 71' near the second electron mirror is typically around 1 mm or even less. The distance d2 between the centers of the first magnetic deflector 74 and the second magnetic deflector 75 is typically around 15 mm. Accordingly, the deflection angle Δ is in the order of a few degrees, for example around 2 degrees or in a range of 1 to 3 degrees. With other words; the deflection angle Δ is in the order of tens of mrad, which is typically the range of existing alignment deflectors in an electron microscope. These alignment and scanning deflectors usually do not deteriorate the resolution of the microscope.

Figure 8:
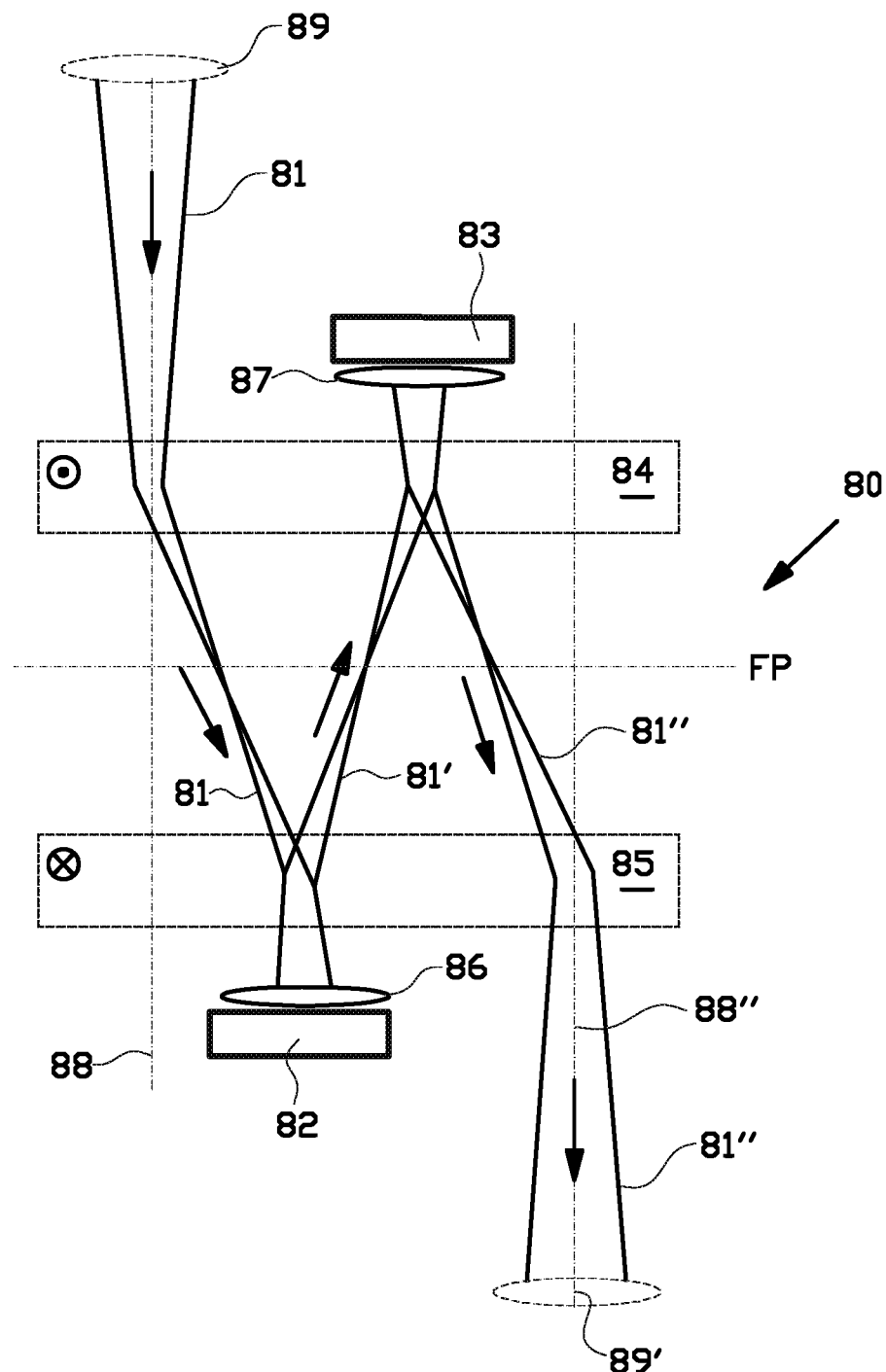
FIG. 8 shows a schematic cross section of an eighth example of an aberration correcting assembly according to the invention.

FIG. 8 shows a schematic cross section of an eighth example of an aberration correcting device 80 according to the invention. The aberration correcting device 80 according to this example is, to a large extend, the same as the fourth example as described above with reference to FIG. 7. Just as in the fourth example, the aberration correcting device 80 comprises a first electron mirror 82 and a second electron mirror 83. At least one of said first electron mirror 82 and second electron mirror 83 is arranged to provide a correcting aberration to a reflected electron beam 81', 81". In between said first and second electron mirrors two magnetic deflectors 84, 85 are arranged. The first magnetic deflector 84 is arranged near the second electron mirror 83, and a second magnetic deflector 85 is arranged between the first magnetic deflector 84 and the first electron mirror 82, preferably near the first electron mirror 82.

As discussed above, the equipotential plane where the kinetic energy of electrons reaches zero provides the reflective face of these electrons. By curving this equipotential plane, it is possible to introduce negative spherical and chromatic aberration into the reflected electron beam. One way to obtain curved equipotential planes is to combine an electron mirror with an electron lens such that the curved equipotential planes of the lens also act as reflective faces for electrons. Such a combination can be arranged to provide curved equipotential planes suitable for at least partially compensating the aberrations of the electron microscope lenses. Accordingly and as indicated in FIG. 8, a first electron lens 86 is arranged in front of the first electron mirror 82, and a second electron lens 87 is arranged in front of the second electron mirror 83.

As schematically shown in FIG. 8, the electron lenses 86, 87 are arranged to provide a focus of the electron beam substantially halfway between the first electron mirror 82 and the second electron mirror 83, as schematically indicated by the focal plane FP. In use, the incoming electron beam 81 is arranged to converge at a focal point in the focal plane FP. The incoming electron beam 81 can be arranged to converge by the optics of the electron microscope, and/or the aberration correcting device 80 can be provided with an additional electron lens 89 arranged on the central axis 88 (the additional electron lens 89 is indicated with a dotted line to indicate that this lens is optional). Just as explained above in the fourth example, the incoming electron beam 81 traverses the first magnetic deflector 84, the second magnetic deflector 85, and is directed towards the assembly of the first electron lens 86 and first electron mirror 82. The assembly of the first electron lens 86 and first electron mirror 82 is arranged to reflect the reflected electron beam 81' back along substantially the same path as the incoming electron beam 81 after the second magnetic deflector 85. The reflected electron beam 81' traverses the second magnetic deflector 85, the first magnetic deflector 84, and is focused substantially at the focal plane FP. Subsequently the reflected electron beam 81' is directed towards the assembly of the second electron lens 87 and second electron mirror 83. The assembly of the second electron lens 87 and second electron mirror 83 is arranged to reflect the double reflected electron beam 81" back along substantially the same path as the reflected electron beam 81' after the first magnetic deflector 84. The double reflected electron beam 81" traverses the first magnetic deflector 84, the second magnetic deflector 85, and is focused substantially at the focal plane FP. After the second magnetic deflector 85 the double reflected electron beam 81" travels along the axis 88' in a direction substantially parallel to the central axis 88, and is directed past the first electron mirror 82 in order to exit the aberration correcting device 80. As schematically indicated in FIG. 8, the double reflected electron beam 81" is a diverging electron beam. Accordingly the optics of the electron microscope can be arranged to further handle this diverging electron beam, and/or the aberration correcting device 80 can be provided with an additional electron lens 89' arranged on the axis 88'(the additional electron lens 89' is indicated with a dotted line to indicate that this lens is optional).

It is noted that the aberration correcting device is configured such that the second electron mirror 83 receives the electron beam 81' at a reflection position on the second mirror 83, which reflection position is arranged spaced apart from the incoming electron beam 81.

It is further noted that just as FIG. 7, figure is not to scale in order to more clearly show the features of the aberration correcting device 80. In particular, the horizontal scale in FIG. 8 is different from the vertical scale. The actual dimensions of the aberration correcting device 80 according to this fifth example may be comparable to the dimensions presented above in the eighth example.

When the beam deflector for separating the incoming and reflected electron beam deflect only over a small angle, in order to minimize the effects of the deflection, the reflected electron beam substantially travels back into the direction of the source, where there is no space for further optical elements or a specimen chamber. Thus, according to the present invention, a second mirror is provided which reflects the electron beam back in its original direction. The consequence of this design is that the incoming electron beam passes close to the second electron mirror, and the outgoing beam passes close to the first electron mirror. In order to arrange the incoming electron beam at a short distance to the second electron mirror, for example less than 1 mm, it is advantageous to use miniaturized electron mirrors.

Figure 9:
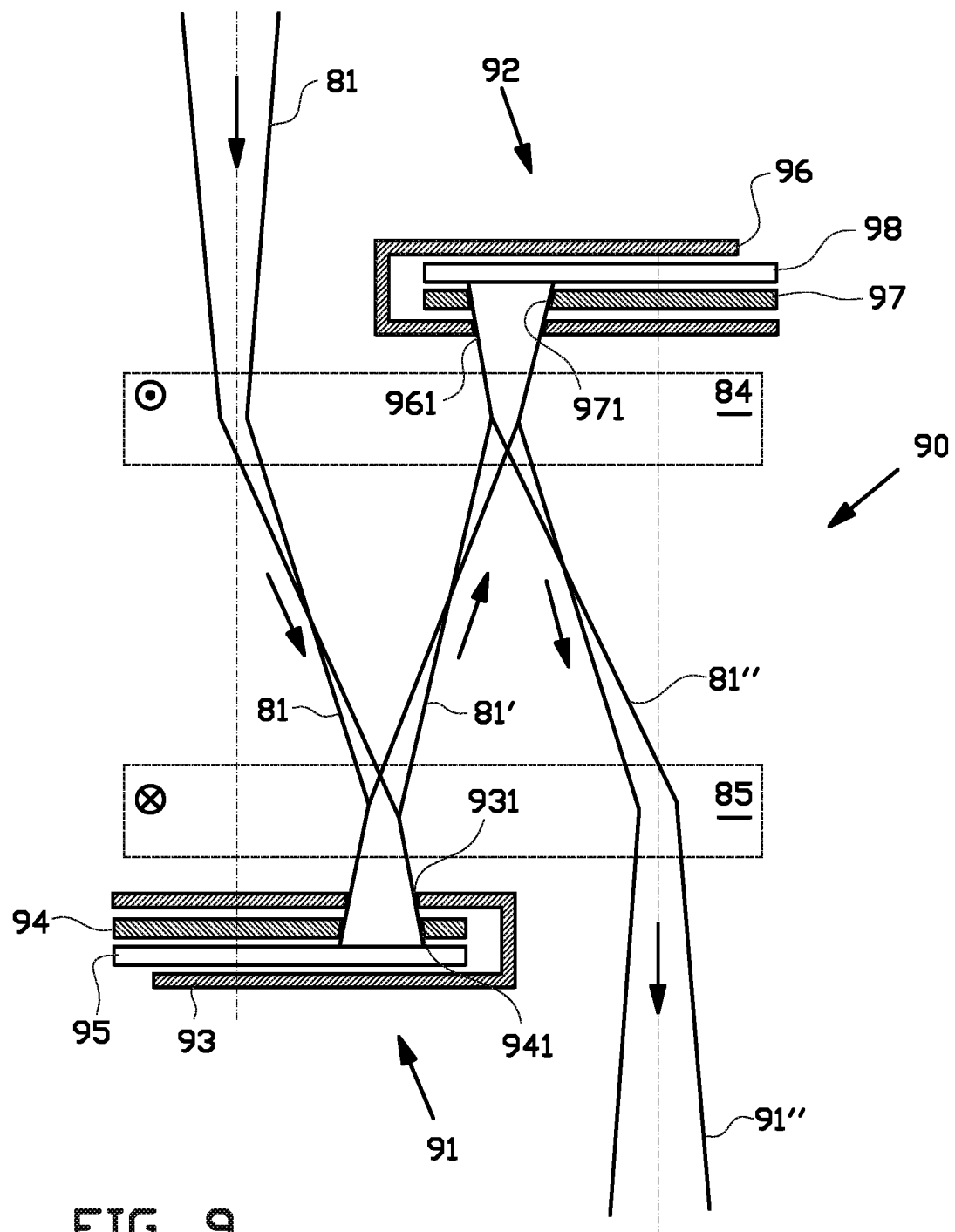
FIG. 9 shows a schematic cross section of a ninth example of an aberration correcting assembly according to the invention.

FIG. 9 shows a schematic cross section of a ninth example of an aberration correcting device 90 according to the invention, which is provided with miniaturized assemblies of an electron lens with an electron mirror. Essentially the aberration correcting device 90 according to the ninth example as shown in figure is the same as the aberration correcting device 90 according to the eighth example as described above with reference to FIG. 8, except for the miniaturized assemblies 91, 92 of an electron lens with an electron mirror. The first assembly 91 comprises a cover electrode 93, a lens electrode 94 and a mirror electrode 95. The cover electrode 93 is, in use, arranged substantially at ground potential. Said cover electrode 93 is provided with an opening 931 for the incoming electron beam 81 and the reflected electron beam 81'. The lens electrode 94 is also provided with an opening 971 for the incoming electron beam 81 and the reflected electron beam 81', which opening 971 in the lens electrode 94 is substantially in line with the opening 931 in the cover electrode 93. The mirror electrode 95 is, in use, arranged at a potential which is slightly more negative than the lens electrode 94. Preferably the first assembly 91 is arranged introduce negative spherical aberration into the reflected electron beam 81'.

The second assembly 92 also comprises a cover electrode 96, a lens electrode 97 and a mirror electrode 98. The cover electrode 96 is, in use, arranged substantially at ground potential. Said cover electrode 96 is provided with an opening 991 for the reflected electron beam 81' and the double reflected electron beam 81". The lens electrode 97 is also provided with an opening 971 for the reflected electron beam 81' and the double reflected electron beam 81", which opening 971 in the lens electrode is substantially in line with the opening 991 in the cover electrode 96. The mirror electrode 98 is, in use, arranged at a potential which is slightly more negative than the lens electrode 97. Preferably the second assembly 92 is arranged introduce negative chromatic aberration into the double reflected electron beam 81". Accordingly, the double reflected electron beam 81" can be provided with a negative spherical aberration and/or a negative chromatic aberration, the amount of negative spherical and/or chromatic aberration can be set by the first assembly 91 and/or the second assembly 92, respectively.

For high resolution microscopes, even the use of magnetic deflectors to provide small deflection angles, as in the third, fourth and fifth example above, can cause some dispersion in the plane of the focused probe beam and/or in the plane of the objective lens. A double deflection using two magnetic deflectors of equal but opposite strength, as in the fourth and fifth example above, displaces the beam while keeping the direction the same. With the two free parameters (strength of the deflection field and distance between the deflectors) both the position and the direction of the electron beam can be made substantially dispersion free. The dispersion of the magnetic deflectors in the intermediate space of the aberration correcting can be compensated by adding further magnetic deflectors in front of and/or behind the aberration correcting device.

Figure 10:
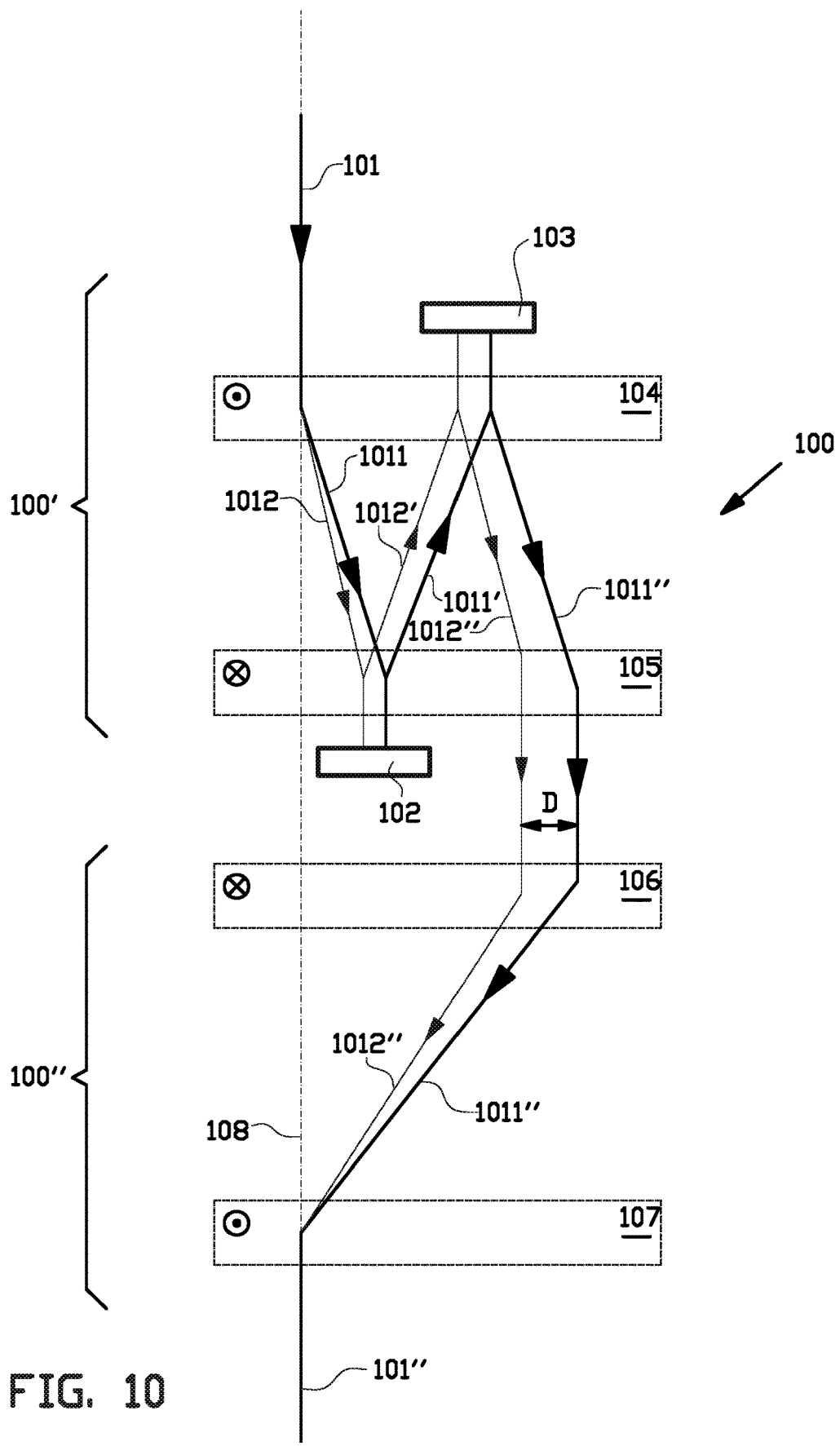
FIG. 10 shows a schematic cross section of a tenth example of an aberration correcting assembly according to the invention.

FIG. 10 shows a schematic cross section of a tenth example of an aberration correcting assembly 100 according to the invention, comprising an aberration correcting device 100' which is substantially equal to the aberration correcting device 100 of the seventh example as described above with reference to FIG. 7, and a set of further magnetic deflectors 100" arranged behind the aberration correcting device 100'. Just as in the fourth example, the aberration correcting device 100' comprises a first electron mirror 102 and a second electron mirror 103. At least one of said first electron mirror 102 and second electron mirror 103 is arranged to provide a correcting aberration to a reflected electron beam. In between said first and second electron mirrors two magnetic deflectors 104, 105 are arranged. The first magnetic deflector 104 is arranged near the second electron mirror 103, and a second magnetic deflector 105 is arranged between the first magnetic deflector 104 and the first electron mirror 102, preferably near the first electron mirror 102. In this example, the incoming electron beam 101 comprises an assembly of electrons with different kinetic energy. Electrons of different kinetic energy are deflected at different angles by the magnetic deflectors 104, 105. Electrons with a low kinetic energy are deflected over a smaller angle than electrons with a high kinetic energy. The reference number 1011 indicates an electron trajectory of electrons with a first kinetic energy, and the reference number 1012 indicates an electron trajectory of electrons with a second kinetic energy. In particular, the first kinetic energy is lower than the second kinetic energy. The dispersion D due to electrons with different kinetic energy yields a relatively broad set of substantially parallel beams exiting the aberration correcting device 100'. It is noted that, just as in the previous examples, the horizontal scale in FIG. 10 is different from the vertical scale to more clearly show the effect of dispersion.

The example of the assembly shown in FIG. 10, further comprises a set 100" of magnetic deflectors 106, 107 which are arranged to compensate for the dispersion of the aberration correcting device 100'. In addition, the set of magnetic deflectors 100" are arranged to bring the outgoing electron beam 101" substantially in line with the incoming electron beam 101 (they are both arranged along the central axis 108 which in use is arranged along the central axis of an electron microscope). It is noted that the magnetic deflectors 106, 107 of said set of magnetic deflectors 100" are arranged to deflect an electron beam in opposite directions and over a substantially equal deflection angle, which deflection angle is dependent on the kinetic energy of the deflected electrons.

It is noted that the aberration correcting device 100 is configured such that the second electron mirror 103 receives the electron beam 1011', 1012' at reflection positions on the second mirror 103, which reflection positions are arranged spaced apart from the incoming electron beam 101.

Figure 11:
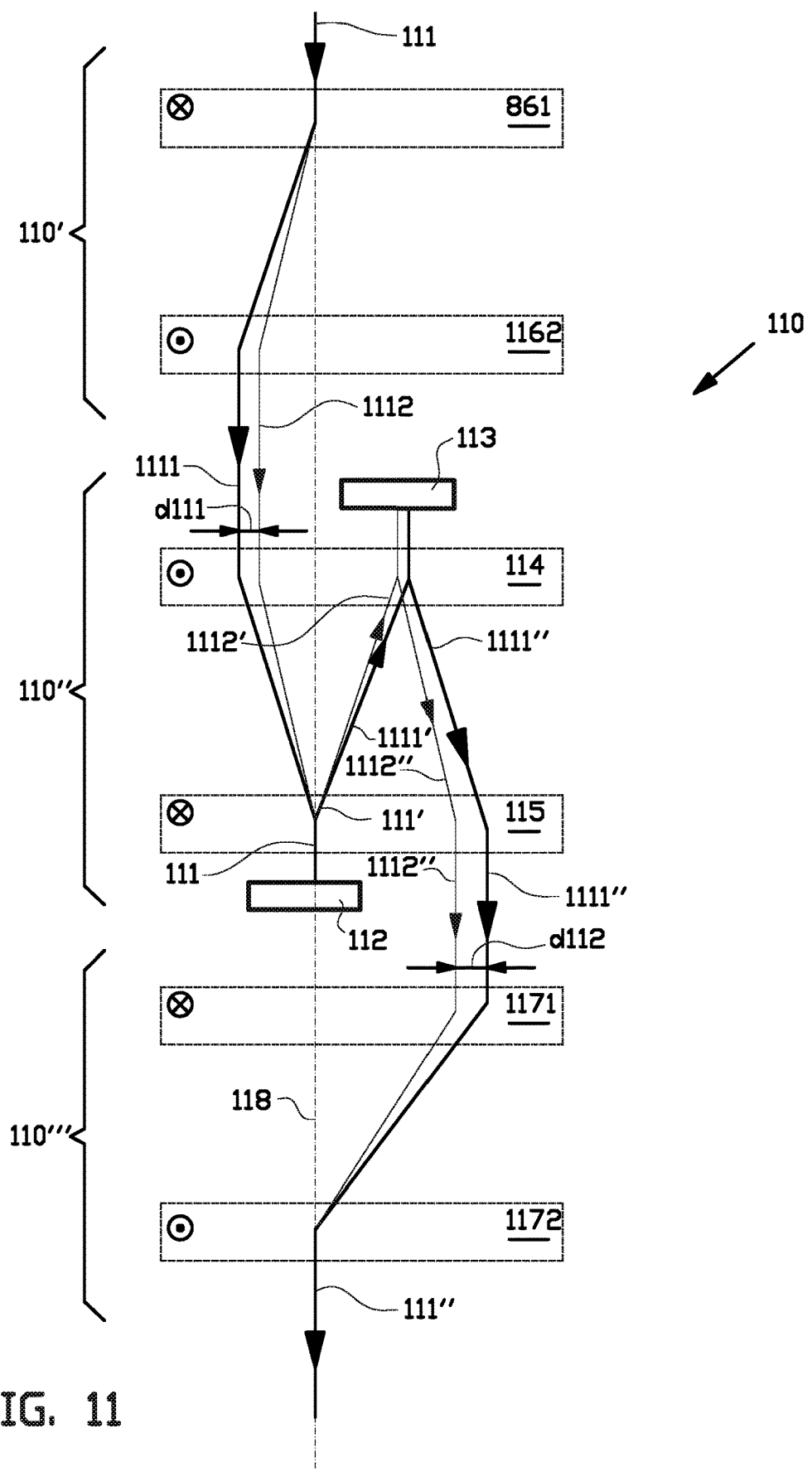
FIG. 11 shows a schematic cross section of an eleventh example of an aberration correcting assembly according to the invention.

In a further example of an aberration correcting assembly 110 as shown in FIG. 11, further magnetic deflectors 110', 110''' are arranged in front of and behind the aberration correcting device 110". Again, the aberration correcting device 110" is substantially equal to the aberration correcting device 70 of the seventh example as described above with reference to FIG. 7. Just as in the seventh example, the aberration correcting device 110" comprises a first electron mirror 112 and a second electron mirror 113. In this example, the first electron mirror 112 is arranged to provide a correcting aberration to a reflected electron beam, preferably to provide a correction for spherical and/or a chromatic aberrations. The second electron mirror 113 is arranged to act as a flat mirror, thus is arranged just to reflect an electron beam substantially without providing a correcting aberration. In between said first and second electron mirrors two magnetic deflectors 114, 115 are arranged. The first magnetic deflector 114 is arranged near the second electron mirror 113, and a second magnetic deflector 115 is arranged between the first magnetic deflector 114 and the first electron mirror 112, preferably near the first electron mirror 112.

In this example, the incoming electron beam 111 comprises an assembly of electrons with different kinetic energy. Electrons of different kinetic energy are deflected at different angles by the magnetic deflectors 114, 115. As shown in the example shown in FIG. 10, the magnetic deflectors 104, 105 already introduce a certain amount of dispersion to the incoming electron beam 101 before the electron beam arrives at the first electron mirror 101. In the example as shown in FIG. 11, a first set of magnetic deflectors 110' is arranged upstream to the aberration correcting device 110". The first set of magnetic deflectors 110' comprises two magnetic deflectors 1161, 1162 which are arranged to deflect an electron beam 111 in opposite directions and over a substantially equal deflection angle, which deflection angle is dependent on the kinetic energy of the deflected electrons. As indicated in FIG. 11, the magnetic deflectors 1161, 1162 are arranged to provide a dispersion dill to the incoming electron beam 1111, 1112. The reference number 1111 indicates an electron trajectory of electrons with a first kinetic energy, and the reference number 1112 indicates an electron trajectory of electrons with a second kinetic energy. In particular, the first kinetic energy is lower than the second kinetic energy. Preferably, the amount of dispersion dill is arranged to at least substantially compensate the amount of dispersion of the first and second magnetic deflectors 114, 115 of the aberration correcting device 110". As a consequence the incoming electron beam 111 is substantially free of dispersion due to the magnetic deflectors of the aberration correcting assembly 110, in particular after the second magnetic deflector 115 and before the incoming electron beam 111 arrives at the first electron mirror 112. Because the incoming electron beam 111 is at least substantially dispersion free the aberration correction by the first electron mirror 112 can be more accurate.

Subsequently, the reflected electron beam 111' from the first electron mirror 112 is directed towards the second electron mirror 113 and traverses the second and first magnetic deflectors 115, 114 of the aberration correcting device 110". Due to the dispersion of said first and second magnetic deflectors 114, 115, the reflected electron beam 111' is provided with a certain amount of dispersion before the dispersed electron beams 1111', 1112' arrive at the second electron mirror 113. At the second electron mirror 113, the dispersed electron beams 1111', 1112' are reflected and the double reflected electron beams 1111", 1112" again traverse the first and second magnetic deflectors 114, 115. Due to the dispersion of said first and second magnetic deflectors 114, 115, the double reflected electron beams are provided with a dispersion d112 when they pass the first electron mirror 112.

As indicated in FIG. 11, the aberration correcting assembly 110 further comprises a second set of magnetic deflectors 110''' which are arranged to compensate for the remaining dispersion d112 of the aberration correcting device 110". In addition, the second set of magnetic deflectors 110''' are arranged to bring the outgoing electron beam 111" substantially in line with the incoming electron beam 111 (they are both arranged along the central axis 118 which in use is arranged along the central axis of an electron microscope). It is noted that the magnetic deflectors 1171, 1172 of said second set of magnetic deflectors 110''' are arranged to deflect an electron beam 1111", 1112" in opposite directions and over a substantially equal deflection angle, which deflection angle is dependent on the kinetic energy of the deflected electrons.

It is noted that the aberration correcting device 110 is configured such that the second electron mirror 113 receives the electron beams 1111', 1112' at reflection positions on the second mirror 113, which reflection positions are arranged spaced apart from the incoming electron beams 1111, 1112, at least at the position where the incoming electron beams 1111, 1112 pass said second mirror 113.

Figure 12:
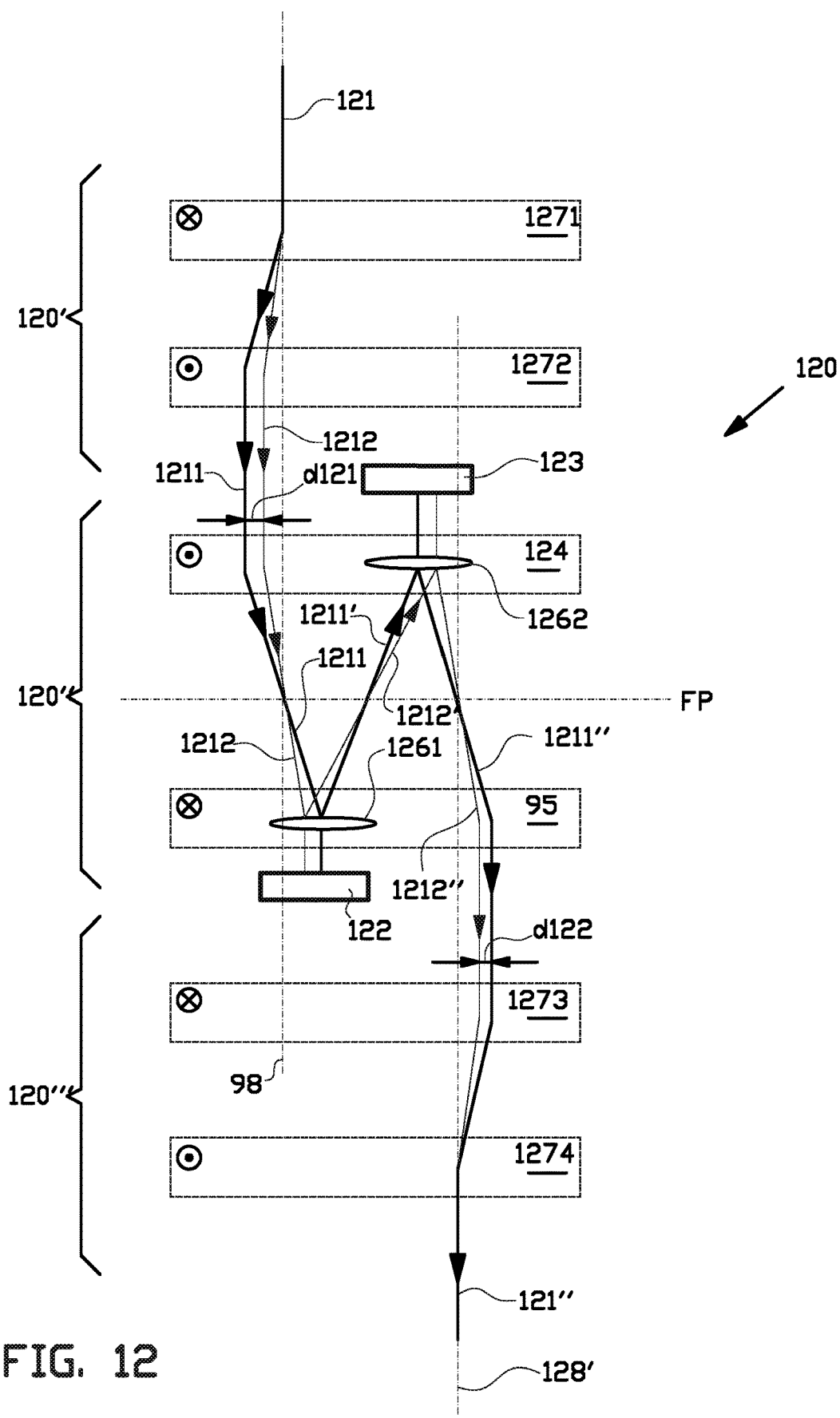
FIG. 12 shows a schematic cross section of a twelfth example of an aberration correcting assembly according to the invention.

In case the aberration correcting device is provided with lenses, for example as in the ninth example as described above with reference to FIG. 9, the deflection for compensating the dispersion of the magnetic deflectors of the aberration correcting device is different from a system without lenses as in the eighth example as described above with reference to FIG. 11. FIG. 12 shows a schematic cross section of a twelfth example of an aberration correcting assembly 120 wherein the aberration correcting device 120" is provided with lenses 1291, 1292. Due to the lenses 1291, 1292 the arrangement of the dispersed beams 1211, 1212 reverses when the dispersed beams 1211, 1212 pass through a focal point in the focal plane FP.

It is noted that the aberration correcting device 120 is configured such that the second electron mirror 123 receives the electron beams 1211', 1212' at reflection positions on the second mirror 123, which reflection positions are arranged spaced apart from the incoming electron beams 1211, 1212, at least at the position where the incoming electron beams 1211, 1212 pass said second mirror 123.

Instead of using a set of magnetic deflectors in front of and/or behind the aberration correcting device, the dispersion of the magnetic deflectors in the aberration correcting device can also be compensated by a set of combined electrostatic-magnetic deflectors arranged in front of and/or behind the aberration correcting device. Such a set of combined electrostatic-magnetic deflectors provide more flexibility to adjust the dispersion and the deflection independent from each other. For a combined electrostatic-magnetic deflector the following equations hold:

$$\beta = \beta_E + \beta_B$$

$$\partial\beta = -(\partial\theta/\theta)(\beta_E + \tfrac{1}{2}\beta_B)$$

wherein $\beta_E$ is the deflection angle due to the electrostatic field, $\beta_B$ is the deflection angle due to the magnetic field, $\partial\beta$ is the dispersion and $\theta$ is the electron acceleration energy. Accordingly, the use of a combined electrostatic and magnetic deflector provides more freedom in designing an aberration correcting assembly in which the outgoing electron beam is in line with the incoming electron beam, even when using an aberration correcting device provided with lenses as schematically shown in FIG. 13.

Figure 13:
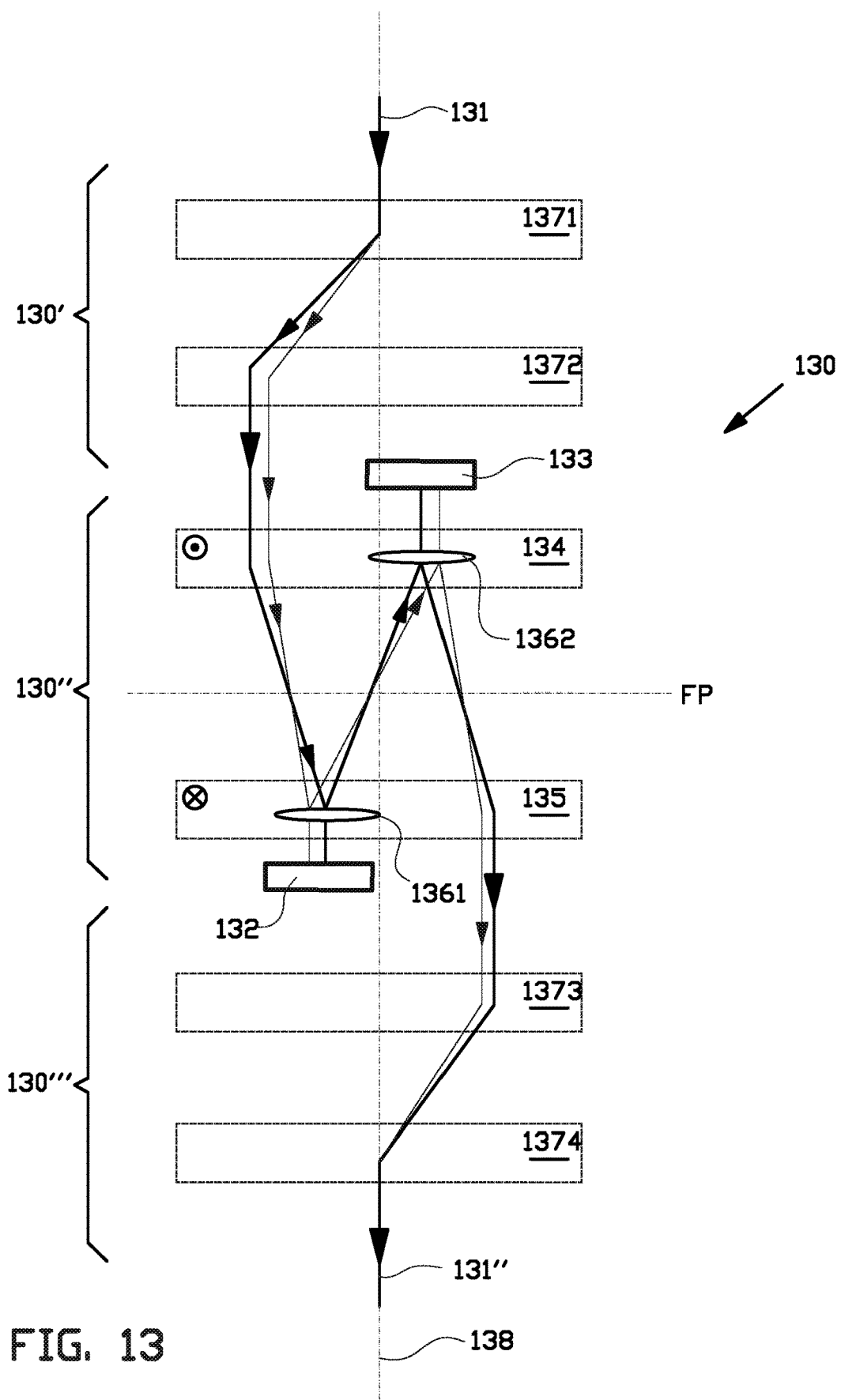
FIG. 13 shows a schematic cross section of a thirteenth example of an aberration correcting assembly according to the invention.

FIG. 13 shows a schematic cross section of a thirteenth example of an aberration correcting assembly 130 according to the invention. As shown in FIG. 13, upstream to the aberration correcting device 130", a set of combined electrostatic-magnetic deflectors 1371, 1372 are arranged to provide the required amount of dispersion fitting and/or optimized for the magnetic deflectors 134, 135 of the aberration correcting device 130". In addition, the set of combined electrostatic-magnetic deflectors 1371, 1372 are arranged to establish the required amount of deflection away from the centre line 138 to provide a substantially symmetric aberration correcting assembly 130 wherein the outgoing electron beam 131" is in line with the incoming electron beam 131, and wherein the aberration correcting device 130" provided with lenses 1391, 1392.

Figure 14:
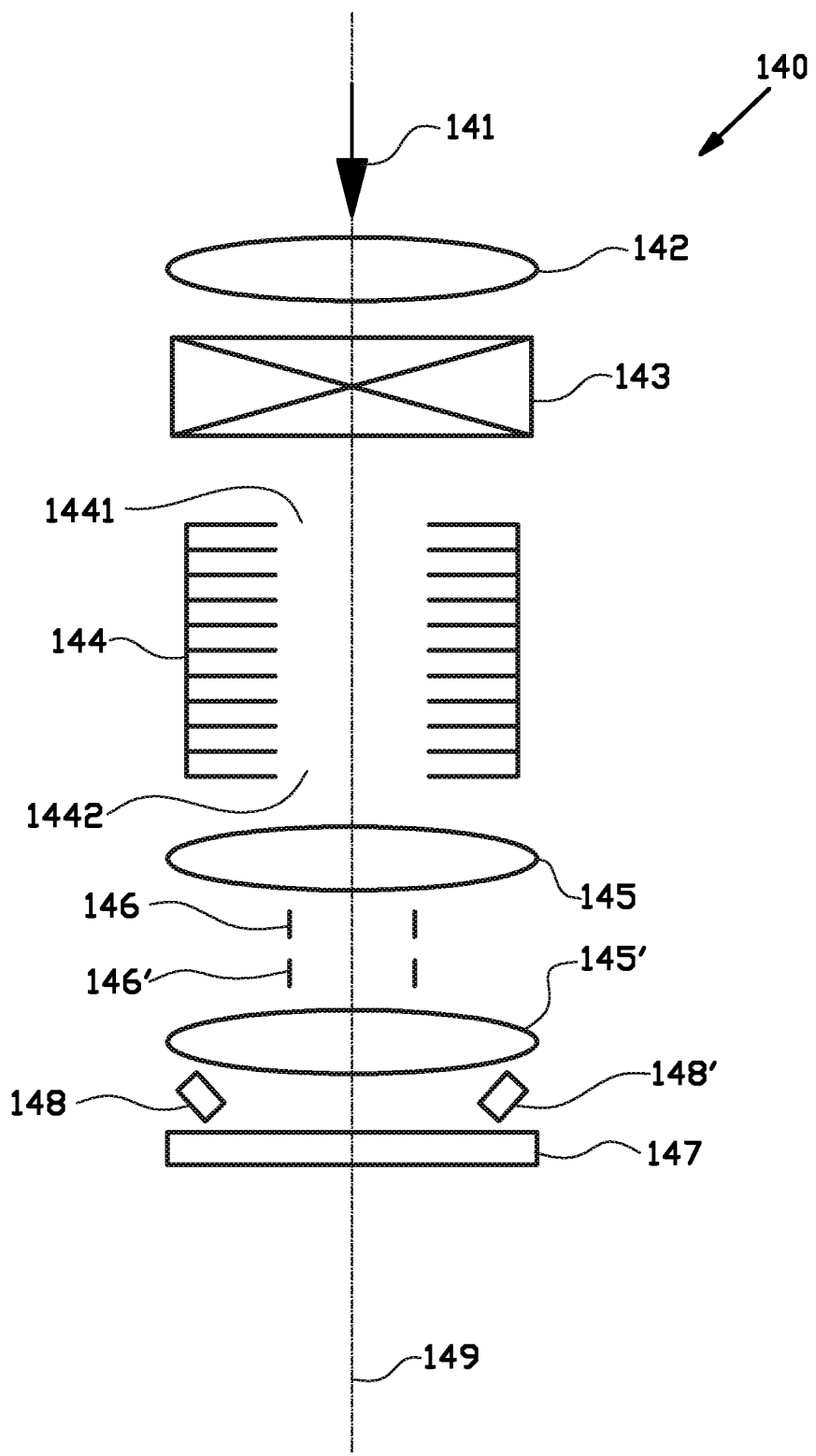
FIG. 14 shows a schematic cross section of an Scanning Electron Microscope comprising an aberration correcting assembly according to the invention.

FIG. 14 shows a schematic cross section of the components of a Scanning Electron Microscope 140 (SEM) comprising an aberration correcting assembly according to the invention. In particular, the components are arranged along a centre axis 149, also denoted as 'optical axis', and comprise an electron source 141, also denoted as 'electron gun' which in use emits a diverging beam of electrons towards the gun lens 142, also denoted as source lens.

From the gun lens 142, a substantially parallel electron beam is directed to an aberration correcting device or aberration correcting assembly 143 according to the invention. Preferably, this aberration correcting assembly 143 is suitably arranged such that the incoming electron beam is in line with the outgoing electron beam, as for example shown in the embodiments of FIGS. 2, 3, 4, 5, 6, 10, 11 and 13. These embodiments are particularly suitable for retrospective installation in the electron beam path of a conventional SEM.

Subsequently, the electron beam from the aberration correcting assembly 143 passes an electron accelerator 144 which is configured to accelerate the electrons of the electron beam towards the sample 147.

The electron accelerator 144 has an input side 1441 and an exit side 1442. The electron accelerator 144 is configured for accelerating electrons from the input side 1441 towards the exit side 1442. As shown in FIG. 14, the aberration correcting device 143 is arranged at the input side 1441 of said electron accelerator 144. Accordingly, the aberration correcting device 143 is arranged in a part of the electron microscope 140 where the electrons have a relatively low energy. After the aberration correcting device 143 has provided the desired compensation for spherical and/or chromatic aberration, the energy of the electrons is increase to the desired level by means of the electron accelerator 144.

The beam of accelerated electrons is focused on top of the sample 147 by means of the objective lens 145, 145'. The objective lens 145, 145' comprises a set of scanning deflectors 146, 146', which are provided for scanning the electron beam over the surface of the sample 147.

The SEM 140 further comprises one or more detectors 148, 148' which are configured for detecting charged particles, such an elastically scattered electrons or secondary electrons, or photons from the sample, which are created in the sample 147 upon incidence of primary electron beam coming from the electron source 141.

Before or in combination with the scanning deflectors 146, 146', an electron microscope is commonly provided with a stigmator (not shown in detail) which is arranged to correct astigmatism in the electron beam. In this respect it is noted that when the aberration correcting assembly 143 comprises an aberration correcting device with one or more magnetic deflectors, the astigmatism caused by said one or more magnetic deflectors can be corrected by the stigmator of the electron microscope 140.

Figure 15:
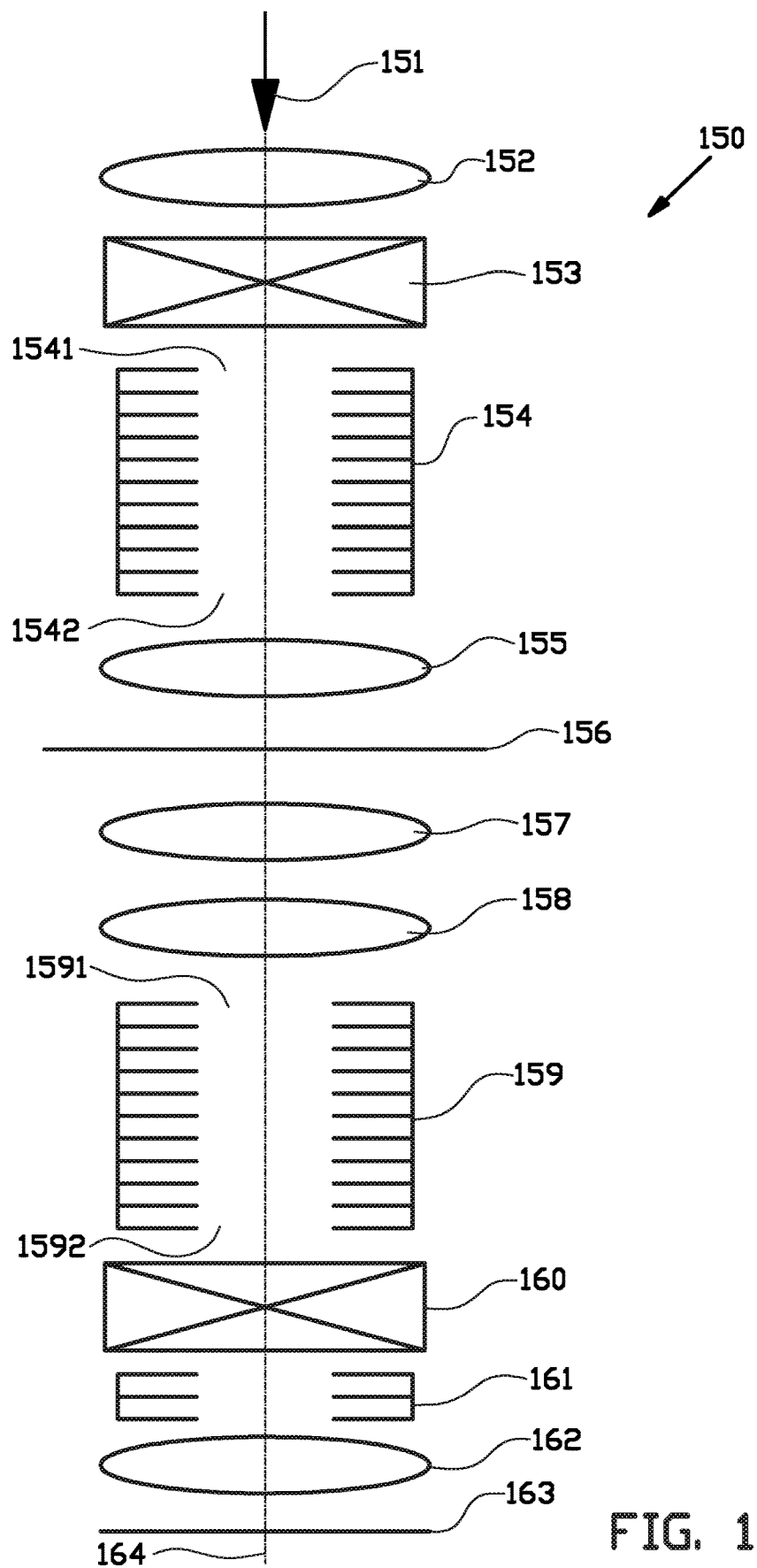
FIG. 15 shows a schematic cross section of a Transmission Electron Microscope comprising an aberration correcting assembly according to the invention.

FIG. 15 shows a schematic cross section of the components of a Transmission Electron Microscope 150 (TEM) comprising an aberration correcting assembly according to the invention. In particular, the components are arranged along a centre axis 164, also denoted as 'optical axis', and comprise an electron source 151, also denoted as 'electron gun' which in use emits a diverging beam of electrons towards the gun lens 152, also denoted as source lens.

From the gun lens 152, a substantially parallel electron beam is directed to an aberration correcting device or aberration correcting assembly 153 according to the invention. Preferably, this aberration correcting assembly 153 is suitably arranged such that the incoming electron beam is in line with the outgoing electron beam, as for example shown in the embodiments of FIGS. 2, 3, 4, 5, 6, 10, 11 and 13. These embodiments are particularly suitable for retrospective installation in the electron beam path of a conventional TEM.

Subsequently, the electron beam from the aberration correcting assembly 153 passes an electron accelerator 154 which is configured to accelerate the electrons of the electron beam towards the sample 156.

The electron accelerator 154 having an input side 1541 and an exit side 1542. The electron accelerator 154 is configured for accelerating electrons from the input side 1541 towards the exit side 1542. As shown in FIG. 15, the aberration correcting device 153 is arranged at the input side 1541 of said electron accelerator 154. Accordingly, the aberration correcting device 153 is arranged in a part of the electron microscope 150 where the electrons have a relatively low energy. After the aberration correcting device 153 has provided the desired compensation for spherical and/or chromatic aberration, the energy of the electrons is increase to the desired level by means of the electron accelerator 154.

The beam of accelerated electrons is focused on the sample 156 by means of the upper objective lens 155. The electrons which have passed the sample 156 are collected by a lower objective lens 157 and a magnification lens 158.

Subsequently, the electron beam from the magnification lens 158 passes an electron decelerator 159 which is configured to accelerate the electrons of the electron beam which have passed the sample 156.

The electron decelerator 159 has an input side 1591 and an exit side 1592. The electron decelerator 159 is configured for decelerating electrons from the input side 1591 towards the exit side 1592. As shown in FIG. 15, a second aberration correcting device 160 is arranged at the exit side 1592 of said electron decelerator 159. Accordingly, also the second aberration correcting device 603 is arranged in a part of the electron microscope 150 where the electrons have a relatively low energy. After the electron decelerator 159 has decreased the energy of the electrons to the sired level, the second aberration correcting device 160 can provided the desired compensation for spherical and/or chromatic aberration.

After the second aberration correcting device 160 has provided the desired compensation for spherical and/or chromatic aberration, the electrons are directed towards the detector 163 via a magnification lens 162.

Optionally, the TEM 150 can be provided with a further accelerator 161 which is configured for accelerating electrons from the aberration correcting device 160 towards the detector 163.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

In summary, the invention relates to an aberration correcting device for correcting aberrations of focusing lenses in an electron microscope. The device comprises a first and a second electron mirror, each comprising an electron beam reflecting face. Between said mirrors an intermediate space is arranged. The intermediate space comprises an input side and an exit side. The first and second electron mirrors are arranged at opposite sides of the intermediate space, wherein the reflective face of the first and second mirror are arranged facing said intermediate space. The first mirror is arranged at the exit side and the second mirror is arranged at the input side of the intermediate space. In use, the first mirror receives the electron beam coming from the input side and reflects said beam via the intermediate space towards the second mirror. The second mirror receives the electron beam coming from the first mirror, and reflects the electron beam via the intermediate space towards the exit side. The incoming electron beam passes said second mirror at a position spaced apart from the reflection position on the second mirror. At least one of the electron mirrors is arranged to provide a correcting aberration to a reflected electron beam. Preferably, said intermediate space is provided with a magnetic or a combined magnetic/electrostatic deflector.

The invention claimed is:

1. An aberration correcting device for correcting aberrations of an electron beam in an electron microscope, wherein the aberration correcting device comprises:
    a first and a second electron mirror, each comprising an electron beam reflecting face,
    an intermediate space, wherein the intermediate space comprises a input side for inputting the electron beam into the intermediate space, and an exit side for exiting the electron beam out of the intermediate space,
    wherein the first and second electron mirror are arranged at opposite sides of the intermediate space, and wherein the reflective face of the first electron mirror and the reflective face of the second mirror are arranged to face said intermediate space,
    wherein the first mirror is arranged at the exit side and is configured to receive the electron beam coming from the input side and to reflect the electron beam via the intermediate space towards the second mirror,
    wherein the second mirror is arranged at the input side and is configured to receive the electron beam coming from the first mirror at a reflection position on the second mirror and to reflect the electron beam via the intermediate space towards the exit side,
    wherein the aberration correcting device is configured such that an incoming electron beam passes said second mirror at a position spaced apart from the reflection position on the second mirror, and
    wherein at least one of said first and second electron mirrors is configured to provide a correcting aberration to a reflected electron beam, wherein said at least one of said first and second mirrors comprises an electrostatic mirror, wherein said electrostatic mirror comprises at least three electrodes, wherein two of said at least two electrodes are configured for transmitting an electron beam and for, in use, providing an electrostatic lens.

2. Aberration correcting device according to claim 1, further comprising a magnetic deflector which is arranged in said intermediate space, which magnetic deflector is configured for separating the incoming and reflected electron beam of said first and/or said second electron mirror.

3. Aberration correcting device according to claim 2, wherein the magnetic deflector is configured to provide a magnetic field substantially perpendicular to a line connecting the first and second electron mirror, preferably connecting the centers of the first and second electron mirrors.

4. Aberration correcting device according to claim 3, comprising an input at the input side for introducing an electron beam into the aberration correcting device, wherein the input and the line connecting the first and second electron mirror define a plane, and wherein the magnetic deflector is configured to provide a magnetic field substantially perpendicular to said plane.

5. Aberration correcting device according to claim 2, further comprising an electrostatic deflector which is arranged in said intermediate space, which electrostatic deflector is configured to provide an electrostatic field which, in use, is configured substantially perpendicular to the magnetic field of the magnetic deflector.

6. Aberration correcting device according to claim 5, wherein the magnetic deflector and the electrostatic deflector are configured to provide a substantially equal deflection angle to an electron beam which traverses said magnetic and electrostatic deflector.

7. Aberration correcting device according to claim 2, wherein the magnetic deflector is a first magnetic deflector, wherein the aberration correcting device comprises a second magnetic deflector which is arranged between the first magnetic deflector and the first electron mirror.

8. Aberration correcting device according to claim 7, wherein the first and second magnetic deflectors are configured to deflect an electron beam in opposite directions.

9. Aberration correcting device according to claim 7, wherein the first and second magnetic deflectors are configured to deflect an electron beam over a substantially equal deflection angle.

10. Aberration correcting device according to claim 1, wherein the at least one magnetic deflector is configured to deflect an incoming electron beam over an angle larger than 0 degrees and smaller than 10 degrees, preferably smaller than 5 degrees.

11. Aberration correcting device according to claim 1, wherein the center line of the first electron mirror is arranged substantially parallel to the center line of the second electron mirror.

12. Aberration correcting device according to claim 1, wherein said at least one of said first and second electron mirrors comprises a cylindrical symmetric electron mirror.

13. Aberration correcting device according to claim 1, wherein one of said first and second electron mirrors is configured to provide a negative spherical aberration and/or a negative chromatic aberration to a reflected electron beam.

14. Aberration correcting device according to claim 13, wherein the other one of said first and second electron mirrors is configured to provide a substantially aberration-free reflection of an electron beam.

15. Aberration correcting device according to claim 1, wherein one of said first and second electron mirrors is configured to provide a negative spherical aberration to a reflected electron beam, and wherein the other one of said first and second electron mirrors is configured to provide a negative chromatic aberration to a reflected electron beam.

16. Aberration correcting device according to claim 1, further comprising a controller or control circuit which is configured to provide a potential difference between said at least two electrodes in order to create a focus of a reflected electron beam substantially halfway between said first and second mirrors.

17. An aberration correcting assembly comprising an aberration correcting device according to claim 1, wherein the assembly further comprises a set of magnetic deflectors, wherein, at least in a traveling direction of an electron beam through said assembly, said set of magnetic deflectors is arranged upstream or downstream with respect to said aberration correcting device.

18. Aberration correcting assembly according to claim 17, wherein the individual magnetic deflectors of said set of magnetic deflectors are configured to deflect an electron beam in opposite directions.

19. Aberration correcting assembly according to claim 17, wherein the individual magnetic deflectors of said set of magnetic deflectors are configured to deflect an electron beam over a substantially equal deflection angle.

20. An electron microscope comprising an electron-optical column comprising electron optical elements for projecting an electron beam from an electron source onto a target, wherein the electron microscope comprises an aberration correcting device according to claim 1.

21. Electron microscope according to claim 20, wherein the electron-optical column comprises an optical axis, and wherein the center line of the first electron mirror and/or the center line of the second electron mirror is arranged substantially parallel to the optical axis.

22. Electron microscope according to claim 20, wherein at least one of said first and second mirrors comprises an electrostatic mirror comprising two or more electrodes, wherein a controller is configured for setting and/or adjusting the potentials of the electrodes of the electrostatic mirror.

23. Electron microscope according to claim 22, wherein said controller is connected to said electrostatic mirror for setting and/or adjusting:
- a correcting aberration of said at least one of said first and second electron mirrors, and/or
- a magnification between the aberration correcting device and a final focusing lens of the electron optical column.

24. Electron microscope according to claim 20, wherein the electron microscope comprises an electron accelerator having an input side and an exit side, wherein the electron accelerator is configured for accelerating electrons from the input side towards the exit side, wherein the aberration correcting device is arranged at the input side of said electron accelerator.

25. Electron microscope according to claim 20, wherein the electron microscope comprises an electron decelerator having an input side and an exit side, wherein the electron decelerator is configured for decelerating electrons from the input side towards the exit side, wherein the aberration correcting device is arranged at the exit side of said electron decelerator.

26. Method of operating an electron microscope according to claim 20, wherein the first and/or second mirror of said aberration correcting device are configured to at least partially counteract aberrations of one or more of said electron optical elements in the electron microscope.

27. Method of operating an electron microscope according to claim 22, wherein the potentials of the electrodes of said electrostatic mirror are adjusted to at least partially counteract the aberrations of one or more of said electron optical elements in the electron microscope.

28. Method of operating an electron microscope according to claim 23, wherein said controller sets and/or adjusts the potentials of the electrodes of the electrostatic mirror for setting and/or adjusting
- the correcting aberration of said at least one of said first and second electron mirrors, and/or
- the magnification between the aberration correcting device and a final focusing lens of the electron optical column.

* * * * *